(12) United States Patent
Yamaguchi

(10) Patent No.: US 8,450,728 B2
(45) Date of Patent: May 28, 2013

(54) SOLID-STATE IMAGING DEVICE, METHOD OF MANUFACTURING THE SAME, AND ELECTRONIC APPARATUS

(75) Inventor: Tetsuji Yamaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 146 days.

(21) Appl. No.: 12/974,295

(22) Filed: Dec. 21, 2010

(65) Prior Publication Data

US 2011/0156104 A1    Jun. 30, 2011

(30) Foreign Application Priority Data

Dec. 28, 2009  (JP) ................. P2009-297930

(51) Int. Cl.
*H01L 31/113*    (2006.01)
(52) U.S. Cl.
USPC ............ 257/40; 257/E31.127; 438/57
(58) Field of Classification Search
USPC .......... 257/432, 440, 443, E31.032, E31.127; 438/57
See application file for complete search history.

(56) References Cited

U.S. PATENT DOCUMENTS

| 2006/0197007 A1* | 9/2006 | Iwabuchi et al. .......... 250/208.1 |
| 2009/0189234 A1* | 7/2009 | Mabuchi ...................... 257/432 |

FOREIGN PATENT DOCUMENTS

| JP | 2002151673 | 5/2002 |
| JP | 2003-031785 | 1/2003 |

* cited by examiner

*Primary Examiner* — Thomas L Dickey
(74) *Attorney, Agent, or Firm* — Dentons US LLP

(57) ABSTRACT

A solid-state imaging device including a semiconductor substrate, a photoelectric conversion portion interposed between a lower electrode and an upper electrode, a contact plug formed so as to connect the lower electrode and the semiconductor substrate in order to read signal charges generated in the photoelectric conversion portion to the semiconductor substrate side, a vertical type transmitting path configured by sequentially laminating a connection portion for electrically connecting the contact plug to the semiconductor substrate, a charge accumulation layer for accumulating the signal charges read to the connection portion, and a potential barrier layer configuring a potential barrier between the connection portion and the charge accumulation layer in a vertical direction of the semiconductor substrate, and a charge reading portion configured to read the signal charges accumulated in the charge accumulation layer to the circuit forming surface side of the semiconductor substrate.

29 Claims, 19 Drawing Sheets

SOLID-STATE IMAGING DEVICE, METHOD OF MANUFACTURING THE SAME, AND ELECTRONIC APPARATUS

RELATED APPLICATION DATA

The present application claims priority to Japanese Priority Patent Application JP 2009-297930 filed in the Japan Patent Office on Dec. 28, 2009, which is incorporated herein by reference in its entirety.

BACKGROUND OF THE INVENTION

The present invention relates to a solid-state imaging device such as a CMOS image sensor or a CCD image sensor including a photoelectric conversion unit in which a plurality of pixels is arranged, and, more particularly, to a back irradiation type solid-state imaging device in which a signal circuit is formed on one surface of a substrate so as to receive light from the other surface of the substrate, a method of manufacturing the solid-state imaging device, and an electronic apparatus using the solid-state imaging device.

In recent CCD type or CMOS type image sensors, the number of photons incident to a unit pixel is reduced with reduction of a pixel size. Therefore, sensitivity or an S/N ratio deteriorates. In the case where a Bayer array using a primary-color color filter is used in order to realize a pixel array in which currently widely-used red, green and blue pixels are arranged in a planar shape, in a red pixel, green and blue light are not transmitted by the color filter. Therefore, in the red pixel, since green and blue lights are used for photoelectric conversion, loss occurs in light use efficiency. In such a pixel configuration, false colors may be generated by performing an inter-pixel interpolation process so as to form a color signal.

In order to solve such problems, in Japanese Unexamined Patent Application Publication No. 2002-151673, a solid-state imaging device in which photoelectric conversion regions for photoelectrically converting green, blue and red lights with respective wavelengths are laminated in a vertical direction of the same pixel and a green photoelectric conversion region is formed of an organic photoelectric conversion film is suggested.

If the structure of Japanese Unexamined Patent Application Publication No. 2002-151673 is used, light loss does not occur in the color filter. In addition, since the interpolation process is not performed, false colors are not generated.

However, in the case where charges photoelectrically converted by the organic photoelectric conversion film are stored in an Si substrate, ohmic contact is necessary in the Si substrate in order to transmit a signal from the organic film to the Si substrate. In the case where electrons are used as photoelectrically converted carriers (signal charges), high-concentration N-type impurities are necessary in ion-implantation into the Si substrate to form an N-type diffusion layer. Thus, a PN junction having a high electric field is formed between the N-type diffusion layer and a peripheral P-well. Therefore, dark current due to the PN junction with the high electric field causes noise. In addition, if the photoelectrically converted signal charges are accumulated in the N-type diffusion layer in which contact is made from the organic photoelectric conversion film, the potential of the N-type diffusion layer is changed according to the accumulation of the signal charges and the electric field applied to the organic photoelectric conversion film is changed according to the accumulation of the signal charges. Then, linearity of an output with respect to an amount of light may not be obtained.

As a method of solving such a problem, in Japanese Unexamined Patent Application Publication No. 2003-31785, a configuration in which signal charges from an organic photoelectric conversion film are transferred to an N-type diffusion layer formed in an Si substrate and are then overflowed is suggested. The method will be described using FIGS. 17 and 18A, 18B and 18C. FIG. 17 is a schematic cross-sectional view of a solid-state imaging device using an organic photoelectric conversion film of the related art. FIG. 18A shows a plan configuration of the main portions of FIG. 17, FIG. 18B shows a cross-sectional configuration corresponding to FIG. 18A, and FIG. 18C is a potential diagram along XVIIIC-XVIIIC in the cross-section of FIG. 18B.

As shown in FIG. 17, in the solid-state imaging device 120 of the related art, an organic photoelectric conversion film 112 interposed between an upper electrode 113 and a lower electrode 111 is laminated directly on a light incidence side of a semiconductor substrate 100. The organic photoelectric conversion film 112 is a film provided for photoelectrically converting a green light. The lower electrode 111 is connected to an n-type diffusion layer (N+) 108 formed by ion-implanting n-type impurities with high concentration in a surface of a well region 101 of the semiconductor substrate 100 through a contact portion 110. That is, signal charges obtained by the organic photoelectric conversion film 112 are transferred to the n-type diffusion layer 108.

In the structure of the related art, a charge accumulation region 107 which is an n-type semiconductor region is formed in a region contacting the n-type diffusion layer 108, and a p-type high-concentration impurity region 109 is formed on a front surface side of the charge accumulation region 107. In addition, a floating diffusion portion FD is formed in a region adjacent to the charge accumulation region 107, and a transfer gate electrode 106 is formed on the semiconductor substrate 100 between the charge accumulation region 107 and the floating diffusion portion FD with a gate insulating film interposed therebetween. The floating diffusion portion FD includes an n-type high-concentration impurity region.

In the structure of the related art shown in FIG. 17, signal charges obtained by the organic photoelectric conversion film 112 are transferred to the n-type diffusion layer 108, and signal charges transferred to the n-type diffusion layer 108 overflow into the charge accumulation region 107. In practice, in order to overflow signal charges in a horizontal direction, an overflow barrier which is a low-concentration p-type impurity region is formed between the n-type diffusion layer 108 and the charge accumulation region 107 so as to obtain the potential configuration shown in FIG. 18C. The potential of the n-type diffusion layer 108 is decided by the overflow barrier, and signal charges going beyond the overflow barrier overflow into the charge accumulation region 107.

In the structure in which the signal charges overflow in the horizontal direction as in the solid-state imaging device 120 of the related art shown in FIGS. 17 and 18A, 18B and 18C, since two capacitors are formed in a pixel, it is disadvantageous in view of reduction of the pixel size. Since the overflow of the horizontal direction is used, an overflow path from the n-type diffusion layer 108 to the charge accumulation region 107 is one-dimensional, a potential gradient of the horizontal direction is necessary for efficient overflow, and the degree of difficulty involved with the potential design is large.

A vertical type overflow path for overflowing signal charges from the n-type diffusion layer 108 connected to the organic photoelectric conversion film 112 by the contact portion 110 to a deep region of the semiconductor substrate 100 is also suggested. FIG. 19A shows a schematic cross-sectional configuration in the case where a vertical type overflow path is configured and FIG. 19B is an enlarged diagram of the main portions thereof. In FIGS. 19A and 19B, portions corresponding to those of FIGS. 18A, 18B and 18C are denoted by the same reference numerals and the description thereof will be omitted.

In the case where the vertical type overflow path is formed, a charge accumulation layer 117 is formed in the semiconductor substrate 100 below the n-type diffusion layer 108. In the case where the vertical type overflow path is formed, the overflow path is two-dimensionally formed so as to increase an area thereof. Thus, it is advantageous in view of overflow. In addition, since potential design in a depth direction is preferable, a potential gradient is given by ion implantation energy and thus processing difficulty is decreased. However, in practice, as shown in FIG. 19B, the n-type diffusion layer 108 is formed as deep as possible so as to cover the damage of the semiconductor substrate 100 and the contact portion 110. Therefore, the charge accumulation layer 117 is separated from the surface of the semiconductor substrate 100 in a depth direction. Accordingly, in the case where signal charges are transferred from the charge accumulation layer 117 to the floating diffusion portion FD through a transfer gate, the charge accumulation layer 117 is separated from the transfer gate. It is disadvantageous in view of transmission.

SUMMARY OF THE INVENTION

The present invention provides a solid-state imaging device with improved transfer efficiency without impeding miniaturization of a pixel, and a method of manufacturing the same, in a solid-state imaging device having a photoelectric conversion portion formed on a light sensing surface side of a semiconductor substrate. In addition, the invention provides an electronic apparatus using the solid-state imaging device.

One embodiment consistent with the present invention includes a solid state imaging device comprising a semiconductor region over a multi-layer wiring layer, a charge accumulation layer in the semiconductor region, a barrier layer on the charge accumulation layer and a connection portion on the barrier layer.

In another embodiment consistent with the present invention, the barrier layer and the connection region are stacked such that the barrier region is positioned closer to the multilayer wiring layer than the connection region.

In another embodiment consistent with the present invention, the barrier layer and the charge accumulation layer are stacked such that the charge accumulation layer is positioned closer to the multilayer wiring layer than the barrier layer.

In another embodiment consistent with the present invention, the solid state imaging device comprises an insulating film on the connection portion and a contact portion that is in contact with the connection portion and extends through the insulating film.

In another embodiment consistent with the present invention, the contact portion electrically connects the connection portion to an electrode over the insulating film.

In another embodiment consistent with the present invention, the insulating film has a negative fixed charge.

In another embodiment consistent with the present invention, the solid state imaging device comprises a light shielding film over the connection portion.

In another embodiment consistent with the present invention, the impurity concentration of the charge accumulation increases proceeding in a direct toward the semiconductor region.

In another embodiment consistent with the present invention, the solid state imaging device comprises a conversion film on the electrode.

In another embodiment consistent with the present invention, the insulating film has a high refractive index.

In another embodiment consistent with the present invention, the insulating film comprises hafnium oxide.

In another embodiment consistent with the present invention, the insulating film comprises aluminum oxide ($Al_2O_3$), zirconium oxide ($ZrO_2$), tantalum oxide ($Ta_2O_5$) or titanium oxide ($TiO_2$), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), hafnium nitride film, an aluminum nitride film, a hafnium oxynitride film or an aluminum oxynitride film.

Another embodiment consistent with the present invention includes a method of manufacturing a solid state imaging device comprising the steps of forming a semiconductor region over a multi-layer wiring layer, forming a charge accumulation layer in the semiconductor region, forming a barrier layer on the charge accumulation layer and forming a connection portion on the barrier layer.

In another embodiment consistent with the present invention, barrier layer and the connection region are stacked such that the barrier region is positioned closer to the multilayer wiring layer than the connection region.

In another embodiment consistent with the present invention, the barrier layer and the charge accumulation layer are stacked such that the charge accumulation layer is positioned closer to the multilayer wiring layer than the barrier layer.

In another embodiment consistent with the present invention, the charge accumulation layer has an impurity concentration lower than that of the connection portion.

In another embodiment consistent with the present invention, the method includes the steps of forming an insulating film on the connection portion, and forming a contact portion that is in contact with the connection portion and that extends through the insulating film.

In another embodiment consistent with the present invention, the contact portion electrically connects the connection portion to an electrode over the insulating film.

In another embodiment consistent with the present invention, the method includes the steps of forming a light shielding film over the connection portion.

In another embodiment consistent with the present invention, the impurity concentration of the charge accumulation gradually increases towards the semiconductor region.

In another embodiment consistent with the present invention, the method includes the step of forming a conversion film on the electrode.

In another embodiment consistent with the present invention, the insulating film comprises hafnium oxide.

In another embodiment consistent with the present invention, the insulating film comprises aluminum oxide ($Al_2O_3$), zirconium oxide ($ZrO_2$), tantalum oxide ($Ta_2O_5$) or titanium oxide ($TiO_2$), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), hafnium nitride film, an aluminum nitride film, a hafnium oxynitride film or an aluminum oxynitride film.

Another embodiment consistent with the present invention includes an electronic apparatus comprising a solid state imaging device comprising (i) a semiconductor region over a multi-layer wiring layer, (ii) a charge accumulation layer in the semiconductor region, (iii) a barrier layer on the charge accumulation layer, and (iv) a connection portion on the barrier layer.

In another embodiment consistent with the present invention, the barrier layer and the connection region are stacked such that the barrier region is positioned closer to the multi-layer wiring layer than the connection region.

In another embodiment consistent with the present invention, the barrier layer and the charge accumulation layer are stacked such that the charge accumulation layer is positioned closer to the multilayer wiring layer than the barrier layer.

In another embodiment consistent with the present invention, the electronic apparatus comprises a shutter device positioned on one side of the solid state imaging device.

In another embodiment consistent with the present invention, the electronic apparatus comprises an insulating film on the connection portion and a contact portion that is in contact with the connection portion and extends through the insulating film.

In another embodiment consistent with the present invention, the electronic apparatus comprises the insulating film comprises hafnium oxide.

In another embodiment consistent with the present invention, the electronic apparatus comprises the insulating film comprises aluminum oxide ($Al_2O_3$), zirconium oxide ($ZrO_2$), tantalum oxide ($Ta_2O_5$) or titanium oxide ($TiO_2$), lanthanum oxide (La2O3), praseodymium oxide (Pr2O3), cerium oxide (CeO2), neodymium oxide (Nd2O3), promethium oxide (Pm2O3), samarium oxide (Sm2O3), europium oxide (Eu2O3), gadolinium oxide (Gd2O3), terbium oxide (Tb2O3), dysprosium oxide (Dy2O3), holmium oxide (Ho2O3), thulium oxide (Tm2O3), ytterbium oxide (Yb2O3), lutetium oxide (Lu2O3), yttrium oxide (Y2O3), hafnium nitride film, an aluminum nitride film, a hafnium oxynitride film or an aluminum oxynitride film.

DESCRIPTION OF THE PRESENTLY PREFERRED EMBODIMENTS

First Embodiment

Solid-State Imaging Device

First, a CMOS-type solid-state imaging device 1 as a first embodiment of the present invention will be described with reference to FIG. 1. The configuration of FIG. 1 according to the following embodiments is commonly used in solid-state imaging devices. In the present embodiment, a back irradiation type CMOS type solid-state imaging device 1 is described.

Figure 1:
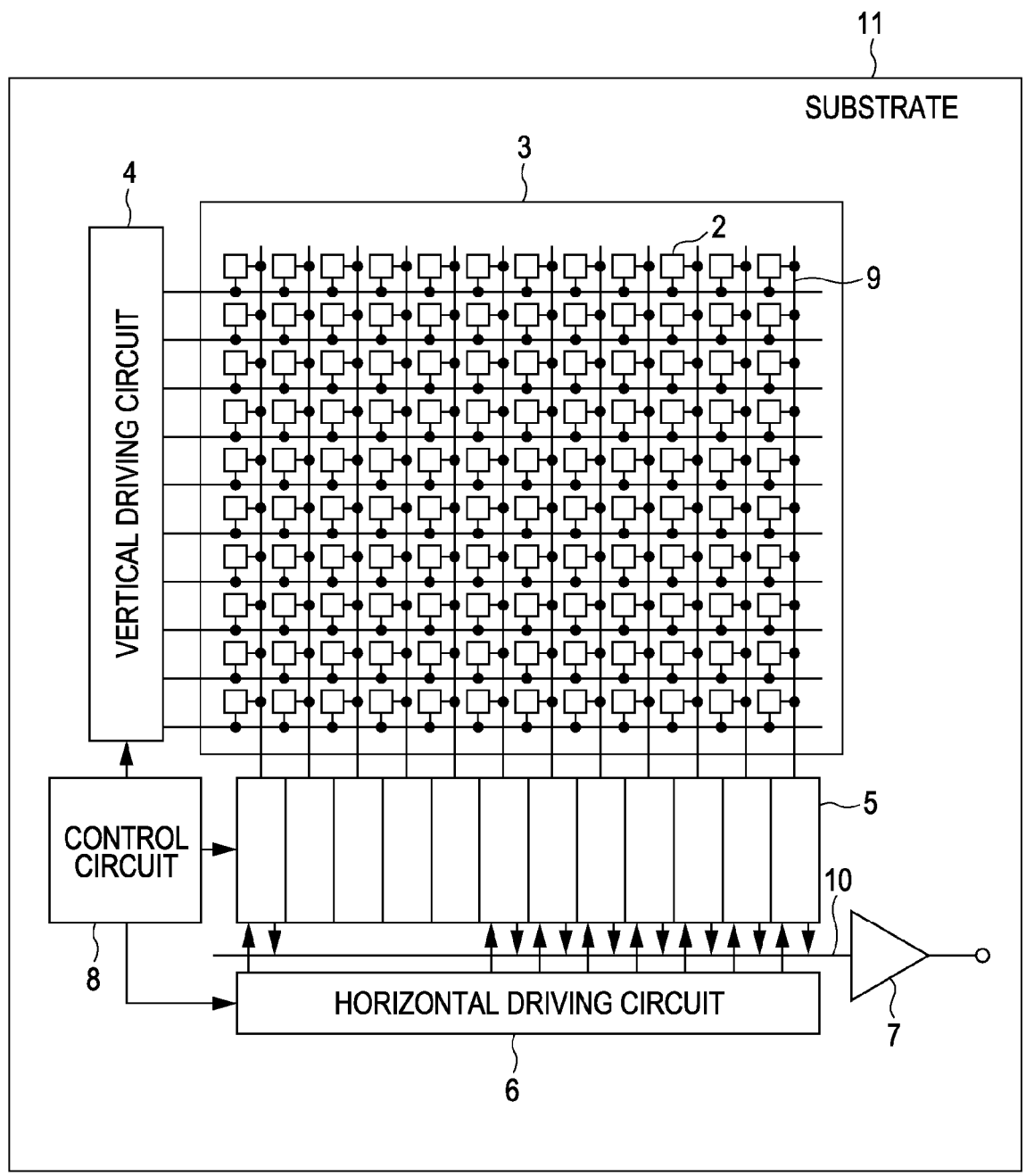
FIG. 1 is a schematic diagram showing the overall configuration of a solid-state imaging device consistent with the present invention.

FIG. 1 is a schematic diagram showing one configuration of a CMOS-type solid-state imaging device 1.

The solid-state imaging device 1 of the present embodiment includes a pixel region 3 in which a plurality of pixels 2 is arranged on a substrate 11 formed of silicon, a vertical driving circuit 4, column signal processing circuits 5, a horizontal driving circuit 6, an output circuit 7, a control circuit 8, and the like.

Each pixel 2 includes a photodiode which is a photoelectric conversion element and a plurality of pixel transistors and a plurality of pixels is regularly arranged on the substrate 11 in a two-dimensional array. The pixel transistors configuring the pixel 2 may include four pixel transistors including a transfer transistor, a reset transistor, a selection transistor, and an amplification transistor, or include three transistors excluding the selection transistor.

The pixel region 3 includes the plurality of pixels 2 regularly arranged in the two-dimensional array. The pixel region 3 includes a valid pixel region for receiving light, amplifying signal charges generated by photoelectric conversion, and reading a signal to the column signal processing circuits 5 and a black reference pixel region (not shown) for outputting optical black which becomes the reference of a black level. The black reference pixel region is generally formed on the outer circumference of the valid pixel region.

The control circuit 8 generates clock signals, control signals or the like which become the reference of the operation of the vertical driving circuit 4, the column signal processing circuits 5 and the horizontal driving circuit 6 and the like, based on a vertical synchronization signal, a horizontal synchronization signal and a master clock. The clock signals, the control signals or the like generated by the control unit 8 are input to the vertical driving circuit 4, the column signal processing circuits 5, the horizontal driving circuit 6 and the like.

The vertical driving circuit 4 includes a shift register so as to sequentially select and scan the pixels 2 of the pixel region 3 in row units in a vertical direction. The photodiode of each pixel 2 supplies a pixel signal based on the signal charges generated according to a light sensing amount to the column signal processing circuit 5 through a vertical signal line 9.

The column signal processing circuit 5 is provided in each column of the pixel 2 so as to perform signal processing such as noise elimination, signal amplification or the like with respect to a signal output from the pixel 2 corresponding to one row in each pixel column, by signals from the black reference pixel region (which, although not shown, is formed around the valid pixel region). A horizontal selection switch (not shown) is provided between the output stage of the column signal processing circuits 5 and the horizontal signal line 10.

The horizontal driving circuit 6 includes a shift register, and sequentially outputs horizontal scan pulses so as to sequentially select each of the column signal processing circuits 5, such that a pixel signal from each of the column signal processing units 5 is output to the horizontal signal line 10.

The output circuit 7 performs signal processing with respect to the signal sequentially supplied from each of the column signal processing circuits 5 through the horizontal signal line 10 and outputs the processed signal.

Figure 2:
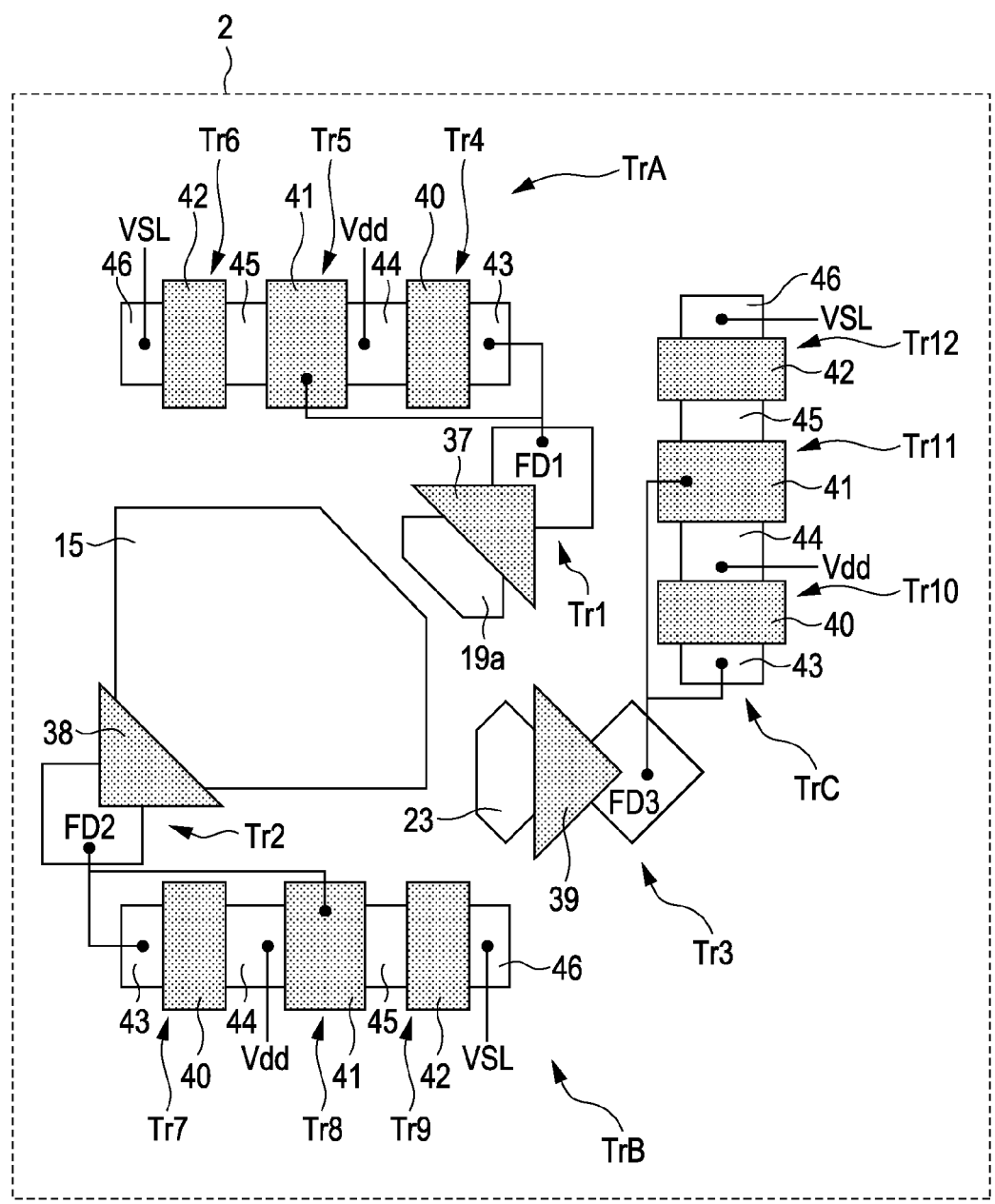
FIG. 2 is a plan view of a unit pixel of the solid-state imaging device consistent with the present invention.

FIG. 2 is a schematic plan view of a unit pixel 2 of the solid-state imaging device consistent with the first embodiment.

As shown in FIG. 2, the unit pixel 2 includes a photoelectric conversion region 15, in which first to third photoelectric conversion portions for photoelectrically converting lights with respective wavelengths of red (R), green (G) and blue (B) are laminated in three layers, and a charge reading unit corresponding to each photoelectric conversion portion. In the present embodiment, the charge reading unit includes first to third pixel transistors TrA, TrB and TrC corresponding to the first to third photoelectric conversion portions. In the solid-state imaging device 1 of the present embodiment, spectroscopy is realized in a vertical direction in the unit pixel 2.

The first to third pixel transistors TrA, TrB and TrC are formed at the periphery of the photoelectric conversion region 15 and each pixel transistor includes four MOS type transistors. The first pixel transistor TrA outputs signal charges generated and accumulated in the below-described first photoelectric conversion portion as a pixel signal, and includes a first transfer transistor Tr1, a reset transistor Tr4, an amplification transistor Tr5 and a selection transistor Tr6. The second pixel transistor TrB outputs signal charges generated and accumulated in the below-described second photoelectric conversion portion as a pixel signal, and includes a second transfer transistor Tr2, a reset transistor Tr7, an amplification transistor Tr8 and a selection transistor Tr9. The third pixel transistor TrC outputs signal charges generated and accumulated in the below-described third photoelectric conversion portion as a pixel signal, and includes a third transfer transistor Tr3, a reset transistor Tr10, an amplification transistor Tr11 and a selection transistor Tr12.

Figure 3:
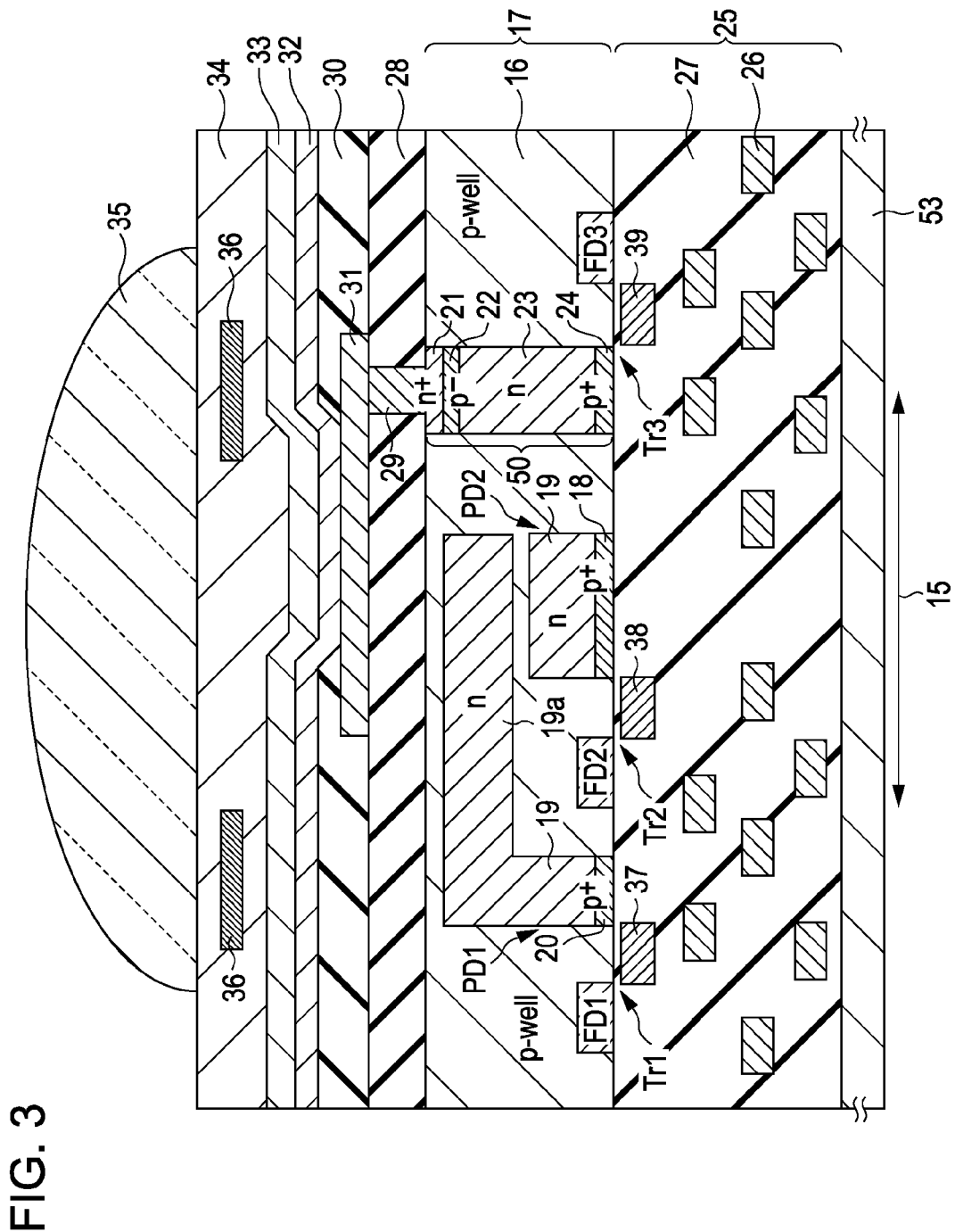
FIG. 3 is a schematic cross-sectional view of a unit pixel of the solid-state imaging device consistent with the present invention.

FIG. 3 is a schematic cross-sectional view of the main portions of the unit pixel 2 of the solid-state imaging device 1. In FIG. 3, only the first to third transfer transistors Tr1, Tr2 and Tr3 of the first to third pixel transistors TrA, TrB and TrC are shown and the other pixel transistors will be omitted. The solid-state imaging device 1 of the present embodiment is a back irradiation type solid-state imaging device in which light is received from a rear surface side opposed to a front surface side of a semiconductor substrate 17 on which pixel transistors are formed. In FIG. 3, an upper side is a light sensing surface side and a lower side is a circuit forming surface in which peripheral circuits such as pixel transistors or logic circuits are formed.

The photoelectric conversion region 15 has a configuration in which the first and second photoelectric conversion portions formed of first and second photodiodes PD1 and PD2 formed in the semiconductor substrate 17 and the third photoelectric conversion portions formed of an organic photoelectric conversion film 32 formed on a rear surface side of the semiconductor substrate 17 are laminated in a light incidence direction.

The first and second photodiodes PD1 and PD2 are formed in a well region 16 formed of a first conductive type (p-type, in the present embodiment) semiconductor region of the semiconductor substrate 17 formed of silicon.

The first photodiode PD1 has an n-type semiconductor region 19 formed of second conductive type (n-type, in the present embodiment) impurities and formed on a light sensing surface side of the semiconductor substrate 17 and an extension 19a formed by extending a portion of the semiconductor region to the front surface side of the semiconductor substrate. The extension 19a is formed at the periphery of the photoelectric conversion region 15 in which the photoelectric conversion portions are laminated in three layers, and a high-concentration p-type semiconductor region 20 which becomes a hole accumulation layer is formed in a front surface (the front surface of the semiconductor substrate) of the extension 19a. The extension 19a is formed as an extraction layer for extracting the signal charges accumulated in the n-type semiconductor region 19 of a first photodiode to the front surface side of the semiconductor substrate 17.

The second photodiode PD2 has an n-type semiconductor region 19 formed on the front surface side of the semiconductor substrate 17 and a high-concentration p-type semiconductor region 18 which becomes a hole accumulation layer formed in the interfacial surface of the semiconductor substrate 17 of the front surface side thereof.

In the first photodiode PD1 and the second photodiode PD2, the p-type semiconductor regions 20 and 18 are formed in the interfacial surface of the semiconductor substrate 17 so as to suppress dark current generated in the interfacial surface of the semiconductor substrate 17.

The second photodiode PD2 formed in a region farthest from a light sensing surface is set as a photoelectric conversion portion for photoelectrically converting a light with a wavelength of red. The first photodiode PD1 formed in the light sensing surface side is set as a photoelectric conversion portion for photoelectrically converting a light with a wavelength of blue.

The organic photoelectric conversion film 32 is formed with an insulating film 28, which becomes a reflection-preventing film formed on the rear surface of the semiconductor substrate 17, interposed therebetween and both upper and lower surfaces thereof are interposed between an upper electrode 33 and a lower electrode 31. In the present embodiment, the organic photoelectric conversion film 32 is set as a photoelectric conversion portion for photoelectrically converting a light with a wavelength of green, and includes an organic photoelectric conversion material including a rhodamine-based pigment, a merocyanine-based pigment, quinacridone or the like. The upper electrode 33 and the lower electrode 31 include a light transmission material and include a transparent conductive film such as an indium tin oxide (ITO) film or an indium oxide zinc film.

Although the material of the organic photoelectric conversion film 32 includes a material for photoelectrically converting a green light in the present embodiment, it may include a material for photoelectrically converting a light with a wavelength of blue or red and the first photodiode PD1 and the second photodiode PD2 may be configured in correspondence with the other wavelengths. In the case where a blue light is absorbed to the organic photoelectric conversion film 32, the first photodiode PD1 formed on the light sensing surface side of the semiconductor substrate 17 is set as a photoelectric conversion portion for converting a green light and the second photodiode PD2 is set as a photoelectric conversion portion for converting a red light. In the case where a red light is absorbed to the organic photoelectric conversion film 32, the first photodiode PD1 formed on the light sensing surface side of the semiconductor substrate 17 is set as a photoelectric conversion portion for converting a blue light and the second photodiode PD2 is set as a photoelectric conversion portion for converting a green light. As the organic photoelectric conversion film for photoelectrically converting a blue light, an organic photoelectric conversion material including a coumaric acid pigment, tris-(8-hydroxyquinolinato) Al (Alq3), a merocyanine-based pigment, or the like may be used. As the organic photoelectric conversion film for photoelectrically converting a red light, an organic photoelectric conversion material including a phthalocyanine-based pigment may be used.

The light photoelectrically converted in the semiconductor substrate 17 is set to blue and red and the light photoelectrically converted in the organic photoelectric conversion film 32 is set to green such that spectral characteristics between the first and second photodiodes PD1 and PD2 can be improved.

The lower electrode 31 formed on the semiconductor substrate 17 side of the organic photoelectric conversion film 32 is connected to a vertical type transmitting path 50 formed from the rear surface side to the front surface side of the semiconductor substrate 17 through a contact plug 29 penetrating the insulating film 28. The vertical transmitting path 50 is configured by a lamination structure of a connection portion 21 formed in a vertical direction from the rear surface side to the front surface side of the semiconductor substrate 17, a potential barrier layer 22, a charge accumulation layer 23 and a p-type semiconductor region 24. The connection portion 21 is a high-concentration n-type impurity region formed on the rear surface side of the semiconductor substrate 17 and is configured with ohmic contact with a contact plug 29. The potential barrier layer 22 is a low-concentration p-type impurity region and configures a potential barrier between the connection portion 21 and the charge accumulation layer 23. The charge accumulation layer 23 is a layer in which signal charges transferred from the organic photoelectric conversion film 32 are accumulated and includes an n-type impurity region with a concentration lower than that of the connection portion 21. The p-type semiconductor region 24 formed in the outermost front surface of the semiconductor substrate 17 includes a high-concentration p-type impurity region so as to suppress dark current in the interfacial surface of the semiconductor substrate 17.

Figure 4A:
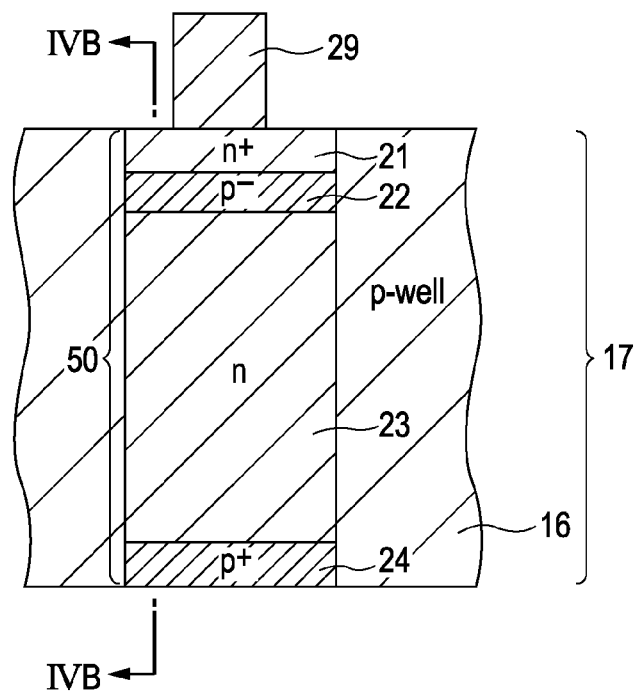
FIGS. 4A and 4B are a cross-sectional view of the main portions of the solid-state imaging device consistent with the present invention and a diagram showing a potential gradient along a line IVB-IVB thereof, respectively.
Figure 4B:
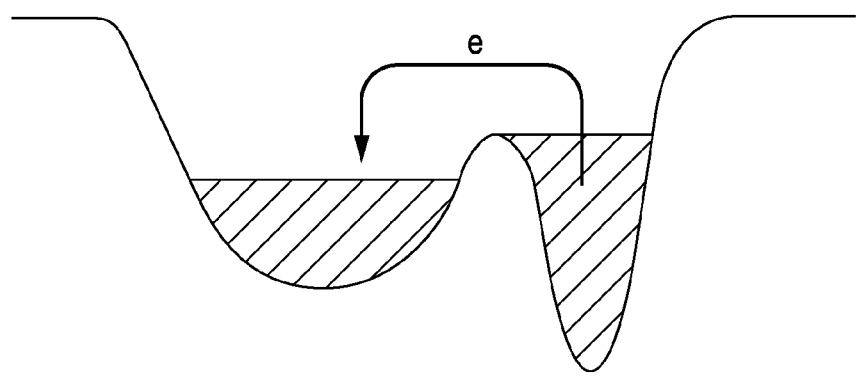

FIG. 4A is an enlarged diagram of a region of the vertical type transmitting path 50 of the semiconductor substrate 17 and FIG. 4B is a cross-sectional view taken along a line IVB-IVB of FIG. 4A.

In the vertical type transmitting path 50 of the present embodiment, a potential gradient shown in FIG. 4B is formed. Therefore, signal charges 'e' transferred from the organic photoelectric conversion film 32 to the connection portion 21 through the contact plug 29 go beyond an overflow barrier formed by the potential barrier layer 22 so as to be accumulated in the charge accumulation layer 23. The signal charges e accumulated in the charge accumulation layer 23 are read to the front surface side which is a circuit forming surface of the semiconductor substrate 17.

On the front surface side which is the circuit forming surface of the semiconductor substrate 17, as shown in FIG. 2, the first to third pixel transistors TrA, TrB and TrC corresponding to the first photodiode PD1, the second photodiode PD2 and the organic photoelectric conversion film 32 are configured. In FIG. 3, for simplification, only the first to third transfer transistors Tr1, Tr2 and Tr3 of the first to third pixel transistors TrA, TrB and TrC are shown.

The first transfer transistor Tr1 includes a floating diffusion portion FD1 formed on the front surface side of the semiconductor substrate adjacent to the extension 19a of the first photodiode PD1 and a transfer gate electrode 37 formed on the semiconductor substrate 17 with a gate insulating film interposed therebetween.

The second transfer transistor Tr2 includes a floating diffusion portion FD2 formed on the front surface side of the semiconductor substrate adjacent to the second photodiode PD2 and a transfer gate electrode 38 formed on the semiconductor substrate 17 with a gate insulating film interposed therebetween.

The third transfer transistor Tr3 includes a floating diffusion portion FD3 formed on the front surface side of the semiconductor substrate adjacent to the vertical type transmitting path 50 and a transfer gate electrode 39 formed on the semiconductor substrate 17 with a gate insulating film interposed therebetween.

Each of the floating diffusion portions FD1, FD2 and FD3 is formed of an n-type high-concentration impurity region, and the transfer gate electrodes 37, 38 and 39 are formed of polysilicon.

On the front surface side of the semiconductor substrate 17, a multi-layer wiring layer 25 having a plurality of laminated wiring layers 26 (three layers, in the present embodiment) with an interlayer insulating film 27 interposed therebetween is formed. A support substrate 53 formed in the manufacturing step is formed on the surface of the multi-layer wiring layer 25.

On the light sensing surface side on the upper electrode 33, a light shielding film 36 for shielding the vertical type transmitting path 50 and the extension 19a which is a charge extracting portion from the first photodiode PD1 is formed. As the light shielding film 36 Al, Ti, W or the like may be used. Although the light shielding film 36 is formed on the upper electrode 33 with an insulating film interposed therebetween in FIG. 3, the potential of the light shielding film 36 is not fixed in the case where the light shielding film 36 is formed on the upper electrode 33 with the insulating film interposed therebetween. Therefore, the light shielding film 36 may be formed so as to be in contact with the upper electrode 33. In this case, the potential of the light shielding film 36 is equal to the potential of the upper electrode 33.

On-chip lenses 35 are formed on the light shielding film 36 with a planarization film 34 interposed therebetween. In the solid-state imaging device of the present embodiment, since spectroscopy is realized in the vertical direction in the unit pixel 2, a color filter is not configured.

As shown in FIG. 2, in practice, the reset transistors Tr4, Tr7 and Tr10, the amplification transistors Tr5, Tr8 and Tr11 and the selection transistors Tr6, Tr9 and Tr12 are formed on the front surface side of the semiconductor substrate 17. The reset transistors Tr4, Tr7 and Tr10 include source/drain regions 43 and 44 and a gate electrode 40. The amplification transistors Tr5, Tr8 and Tr11 include source/drain regions 44 and 45 and a gate electrode 41. The selection transistors Tr6, Tr9 and Tr12 include source/drain regions 45 and 46 and a gate electrode 42.

In these pixel transistors TrA, TrB and Trc, the floating diffusion portions FD1, FD2 and FD3 are connected to one source/drain region 43 of the reset transistors Tr4, Tr7 and Tr10 corresponding thereto. In addition, the floating diffusion portions FD1, FD2 and FD3 are connected to the gate electrode 41 of the amplification transistors Tr5, Tr8 and Tr11 corresponding thereto.

A power voltage line VDD is connected to a common source/drain region 44 by the reset transistors Tr4, Tr7 and Tr10 and the amplification transistors Tr5, Tr8 and Tr11. A selection signal line VSL is connected to one source/drain region 46 of the selection transistors Tr6, Tr9 and Tr12.

Next, a method of manufacturing the solid-state imaging device 1 of the first embodiment will be described. FIGS. 5A, 5B and 5C to 8A and 8B are diagrams showing a process of manufacturing the solid-state imaging device 1 of the present embodiment and, more particularly, a process of manufacturing of a region in which the vertical type transmitting path 50 is formed.

Figure 5A:
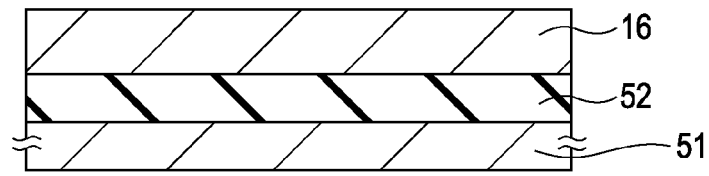
FIGS. 5A, 5B and 5C are diagrams showing a process of manufacturing the solid-state imaging device consistent with the present invention.

First, as shown in FIG. 5A, an SOI substrate obtained by sequentially forming a buried oxide film (hereinafter, referred to as a BOX layer 52) and a semiconductor layer 17 formed of silicon on a substrate 51 formed of silicon is prepared. This semiconductor layer 17 corresponds to the semiconductor substrate 17 of FIG. 3. The semiconductor layer 17 of the SOI substrate of FIG. 5A is a p-type semiconductor layer and the thickness thereof is 200 to 300 nm. At this time, the thickness of the semiconductor layer 17 enables ion implantation for an n-type diffusion layer in a subsequent process.

Figure 5B:
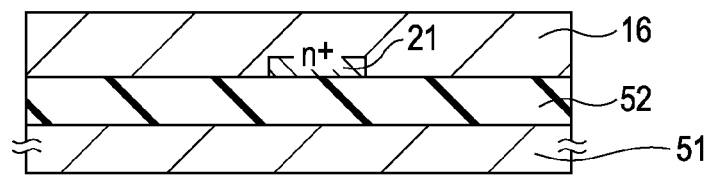

Next, as shown in FIG. 5B, n-type impurities are ion-implanted into the semiconductor layer 17 of the interfacial surface of the BOX layer 52 with a high concentration so as to form the connection portion 21. Since this connection portion 21 is in ohmic contact with the contact plug 29 for extracting signal charges from the organic photoelectric conversion film 32, the connection portion has a concentration of about $1 \times 10^{19}$ to $1 \times 10^{20}/cm^3$. At this time, since ion implantation may be performed in a state in which the semiconductor layer 17 of the SOI substrate is thinly formed, high-concentration ion implantation is possible. In addition, the connection portion 21 can be formed at a deep position of the semiconductor layer 17 with high accuracy.

Figure 5C:
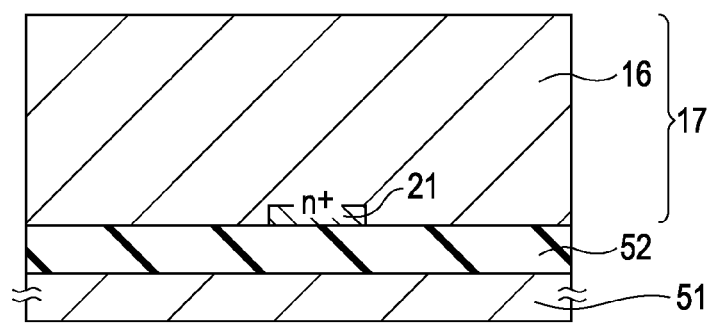

Next, as shown in FIG. 5C, a p-type semiconductor region is formed on the semiconductor layer 17 using an epitaxial growth method such that the film thickness of the semiconductor layer 17 becomes a desired thickness. A first photodiode PD1 corresponding to a blue light and a second photodiode PD2 corresponding to a red light is formed in the semiconductor layer 17. In particular, in order to sufficiently secure the sensitivity of a light with a wavelength of red, the thickness of the semiconductor layer 17 is at least about 3 μm.

It is difficult to form the semiconductor layer 17 with the thickness of about 3 μm from the beginning and to form the connection portion 21 with a concentration of $1 \times 10^{19}$ to $1 \times 10^{20}/cm^3$ in a deep region of the semiconductor layer 17, in terms of productivity. Accordingly, similarly to the present embodiment, an example of forming the connection portion 21 at a point of time when the semiconductor layer 17 is thinly formed and obtaining the semiconductor layer 17 with a desired film thickness using the epitaxial growth method is preferable. In addition, the semiconductor layer 17 formed by the epitaxial growth method becomes a well region 16 in which the pixel 2 is formed.

Figure 6A:
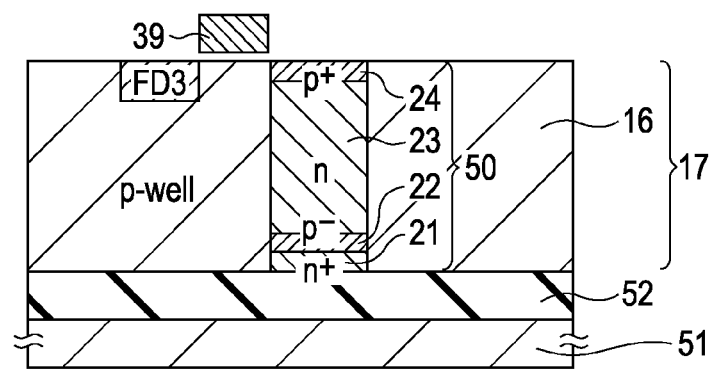
FIGS. 6A and 6B are diagrams showing the process of manufacturing the solid-state imaging device consistent with the present invention.

Next, as shown in FIG. 6A, p-type impurities are ion-implanted into the upper side of the connection portion 21 in the vertical direction with a low concentration so as to form the potential barrier layer 22 and, subsequently, n-type impurities are ion-implanted into the upper side of the potential barrier layer 22 in the vertical direction so as to form the charge accumulation layer 23. The impurity concentration of the charge accumulation layer 23 is lower than that of the connection portion 21 and the charge accumulation layer 23 is formed by stepwise ion implantation such that the concentration thereof is gradually increased from the side of the potential barrier layer 22 to the front surface side of the semiconductor layer 17. In addition, p-type impurities are ion-implanted into the upper side of the charge accumulation layer 23, that is, the outermost front surface of the semiconductor layer 17, in the vertical direction with a high concentration so as to form a dark current suppression region which is formed of the p-type semiconductor region 24. Accordingly, the vertical type transmitting path 50 formed in the vertical direction from the surface, which is in contact with the BOX layer 52 of the semiconductor layer 17, to the front surface side is formed.

Thereafter, the transfer gate electrode 39 is formed on the front surface of the semiconductor layer 17 with a gate oxide film (not shown) interposed therebetween. In addition, n-type impurities are ion-implanted into a desired region of the front surface of the semiconductor layer 17 with a high concentration so as to form the floating diffusion portion FD3. Although not shown in FIG. 5D, at this time, the first and second photodiodes PD1 and PD2 or the source/drain regions or the gate electrodes configuring the first to third pixel transistors TrA, TrB and Trc are formed in the other region of the semiconductor layer 17.

Figure 6B:
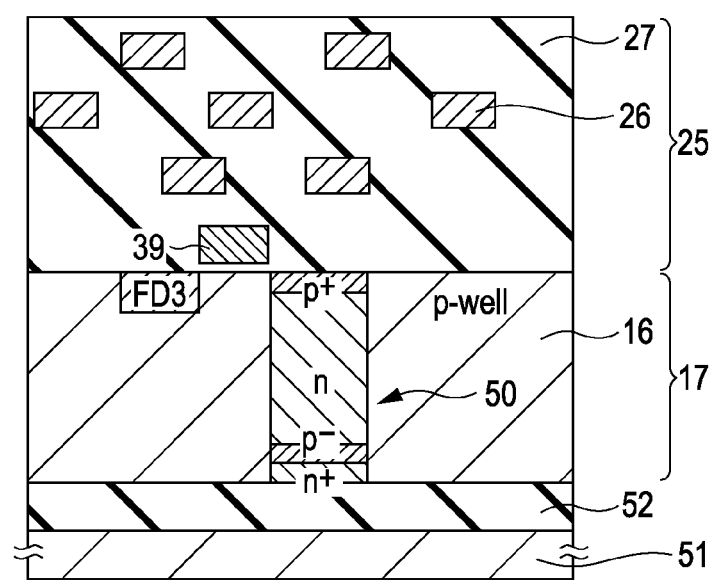

Next, as shown in FIG. 6B, a process of depositing the interlayer insulating film 27 formed of silicon oxide and a process of forming a metal contact (not shown) and the wiring 26 formed of a metal material on the front surface side of the semiconductor layer 17 are repeated. Therefore, the multi-layer wiring layer 25 formed of the interlayer insulating film 27 and the plurality of wiring layers 26 (three layers, in the present embodiment) is formed. As the metal material configuring the wiring 26 copper or aluminum may be used.

Figure 7A:
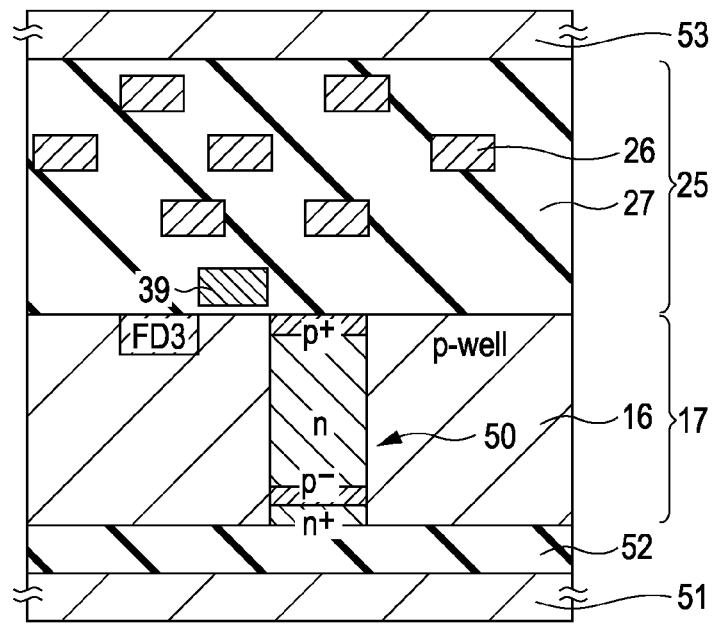
FIGS. 7A and 7B are diagrams showing the process of manufacturing the solid-state imaging device consistent with the present invention.

Next, as shown in FIG. 7A the support substrate 53 formed of silicon is attached onto the multi-layer wiring layer 25.

Figure 7B:
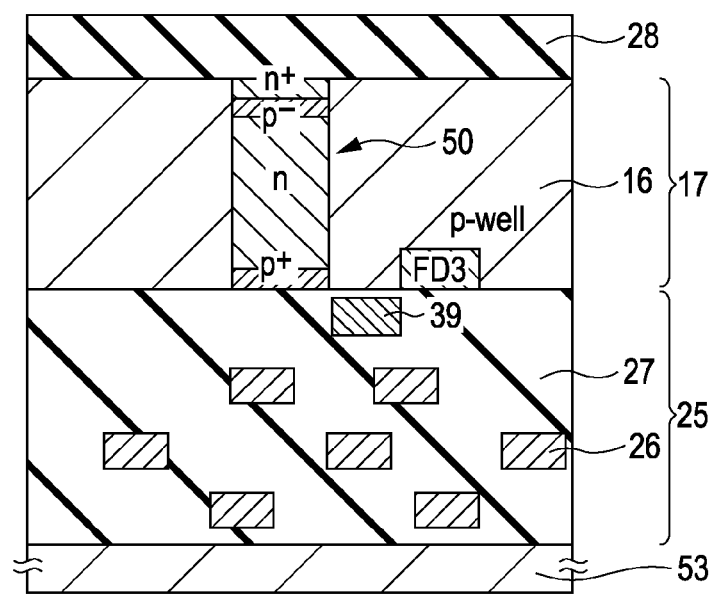

Next, as shown in FIG. 7B, the device is reversed, the substrate 51 and the BOX layer 52 configuring the SOI substrate are removed, and an insulating film 28 which also functions as a reflection prevention film is formed on the rear surface of the semiconductor layer 17 which is the light incidence surface. In the insulating film 28, a material having a high refractive index and an interfacial surface with a small defect level with the semiconductor layer may be used in order to suppress the reflection of the incident light to the first and second photodiodes PD1 and PD2 formed in the semiconductor layer 17. As the insulating film 28 having such characteristics a lamination film formed of a silicon oxide film ($SiO_2$) formed on the interfacial surface of the semiconductor layer 17 with a thickness of 1 nm to 2 nm and a hafnium oxide ($HfO_2$) having a refractive index n of about 2 formed thereon is preferably used.

The insulating film 28 formed on the rear surface side of the semiconductor layer 17 may preferably use a film having negative fixed charges. Since hafnium oxide uses negative fixed charges, a state in which holes are accumulated in the interfacial surface of the rear surface side of the semiconductor layer 17 is enhanced. Accordingly, it is possible to suppress generation of dark current.

As the material having the negative fixed charges, in addition to hafnium oxide ($HfO_2$), aluminum oxide ($Al_2O_3$), zirconium oxide ($ZrO_2$), tantalum oxide ($Ta_2O_5$) or titanium oxide ($TiO_2$) may be used. As the method of forming the film a chemical vapor growth method, a sputtering method, an atomic layer deposition method or the like may be used. If the atomic layer deposition method is used, it is preferable that an $SiO_2$ film for reducing the interface state during film formation is simultaneously formed to be about 1 nm. As the other materials, lanthanum oxide ($La_2O_3$), praseodymium oxide ($Pr_2O_3$), cerium oxide ($CeO_2$), neodymium oxide ($Nd_2O_3$), promethium oxide ($Pm_2O_3$) or the like may be used. In addition, as the materials, samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$) may be used. In addition, as the materials, holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$) or the like may be used. In addition, the film having the negative fixed charges may be formed of a hafnium nitride film, an aluminum nitride film, a hafnium oxynitride film or an aluminum oxynitride film.

In the film having the negative fixed charges, silicon (Si) or nitride (N) may be added to the film in a range which does not impede the insulation property. The concentration thereof is appropriately determined in a range which does not impede the insulation property of the film. By adding silicon (Si) or nitride (N), it is possible to improve the heat resistance of the film or the blocking capability of ion implantation during the process.

Figure 8A:
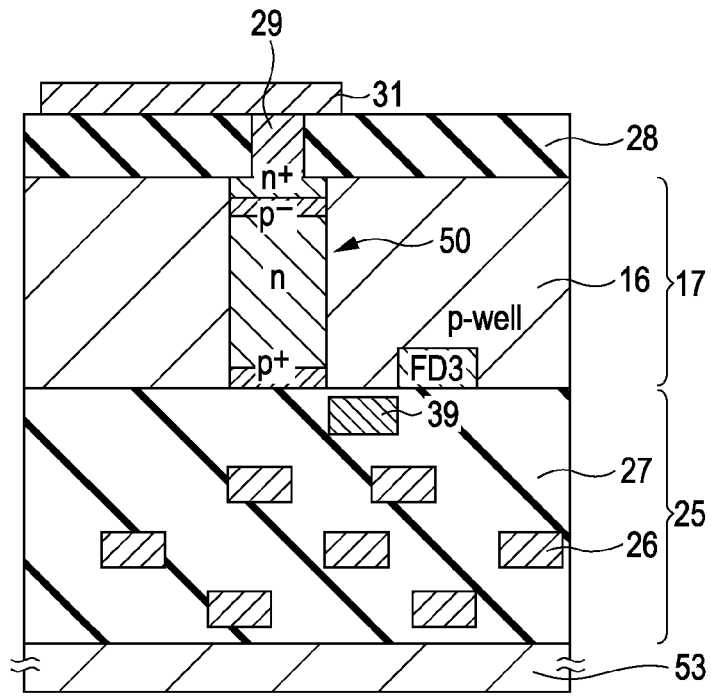
FIGS. 8A and 8B are diagrams showing the process of manufacturing the solid-state imaging device consistent with the present invention.

Next, as shown in FIG. 8A, the contact plug 29 penetrating the insulating film 28 so as to be connected to the connection portion 21 of the semiconductor layer 17 is formed. The contact plug 29 is formed by opening a predetermined position of the insulating film 28 so as to form a contact hole which the connection portion 21 faces, forming a barrier metal film on the sidewall and the bottom of the contact hole, and burying a metal material. For ohmic contact with the semiconductor layer 17, a lamination film of titanium (Ti) and titanium nitride (TiN) is preferably used as the barrier metal film, and tungsten (W) is preferably used as the metal material buried in the contact hole. Thereafter, the lower electrode 31 is formed on the insulating film 28 including the contact plug 29 in a desired region. As the transparent electrode which is the lower electrode 31 an ITO film formed using a sputter method with a thickness of about 100 nm may be used or may be patterned in a desired shape using dry etching or wet etching so as to be formed. An etching gas mixture of $Cl_2$, $BCl_3$ and Ar may be used in dry etching, and an etchant such as phosphoric acid solution or a mixed solution including oxalic acid and phosphoric acid may be used in wet etching.

Figure 8B:
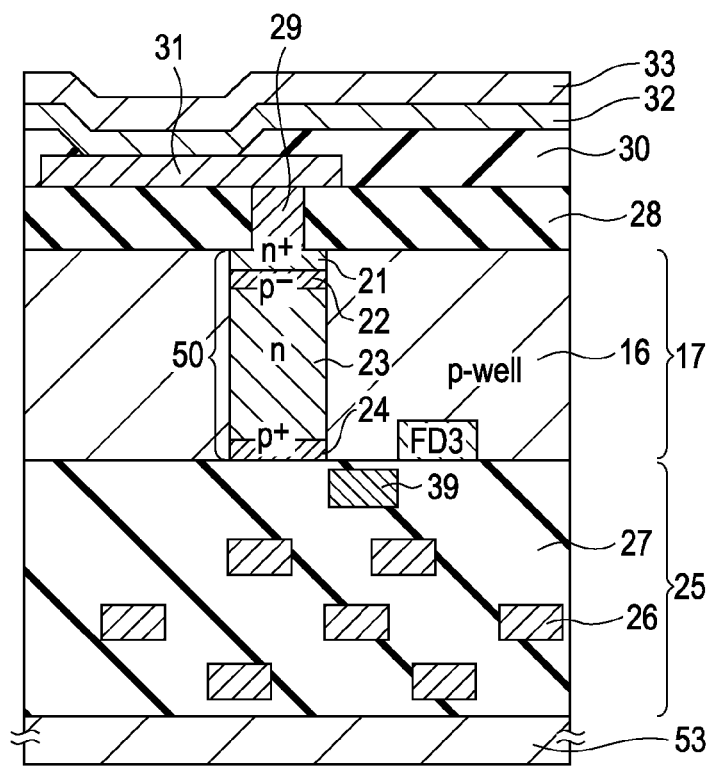

Next, as shown in FIG. 8B the insulating film 30 formed of silicon oxide is formed so as to cover the lower electrode 31 and an opening to expose the lower electrode 31 is formed in the insulating film 30 on the lower electrode 31. The opening is preferably formed in a taper shape as shown in FIG. 8B in order to suppress a step difference of an edge portion of the lower electrode 31. More preferably, the taper angle of the opening of the insulating film 30 is equal to or less than 30 degrees. A resist mask having a taper shape is formed on the insulating film 30 formed of silicon oxide and is etched back so as to form a desired taper angle.

Thereafter, the organic photoelectric conversion film 32 is formed on the entire surface of the insulating film 30 while covering the opening. In the present embodiment, as the organic photoelectric conversion film 32, the film is formed using quinacridone, which is an organic photoelectric conversion material selectively absorbing a green light using vacuum deposition with a thickness of about 100 nm. Thereafter, the upper electrode 33 is formed on the entire surface of the organic photoelectric conversion film 32. Even in the upper electrode 33, similarly to the lower electrode 31 an ITO film with a thickness of 100 nm is used using a sputter method.

Thereafter, the light shielding film 36 and the planarization film 34 are formed on the upper electrode 33 and the on-chip lenses are formed thereon, thereby completing the solid-state imaging device 1 of the present embodiment of FIG. 3.

In the method of manufacturing the solid-state imaging device 1 of this embodiment, since it is possible to easily control the potential of the vertical type transmitting path 50 in the vertical direction by means of the energy at the time of ion implantation, control is easy and design is easy.

Next, a method of driving the solid-state imaging device 1 of the first embodiment will be described. The driving method will be described using FIGS. 2 and 3.

In the present embodiment, a fixed negative voltage VL is applied to the upper electrode 33 formed on the light sensing surface side of the organic photoelectric conversion film 32, and a voltage VH higher than the voltage VL is applied to the lower electrode 31 connected to the contact plug 29 at the time of charge accumulation. The voltage VH is determined by the potential of the overflow barrier.

When a light is input to one pixel 2 at the time of charge accumulation, a light with a wavelength of green is converted in the organic photoelectric conversion film 32 having the absorption characteristics with respect to the light with the wavelength of green and electron-hole pairs are formed in the organic photoelectric conversion film 32. Among the electron-hole pairs generated by the photoelectric conversion, electrodes which are signal charges are attracted to the lower electrode 31, to which a high voltage VH is applied, and are transferred to the connection portion 21 through the contact plug 29. The signal charges exceeding a saturation charge amount of the connection portion 21 go beyond the potential barrier layer 22 so as to overflow into the charge accumulation layer 23 and are accumulated in the charge accumulation layer 23.

At this time, the holes are attracted to the upper electrode 33 to which the negative voltage VL is applied and discharged through a demanded wiring (not shown). In the present embodiment, since the high voltage VH is applied to the lower electrode 31, the high voltage corresponds to the polarity of the bias voltage for generating dark current in the interfacial surface of the rear surface side of the semiconductor substrate 17. However, hafnium oxide is used in the insulating film 28 configuring the reflection prevention film such that the holes are excited in the rear surface of the semiconductor substrate 17. Accordingly, it is possible to suppress dark current generated in the interfacial surface of the semiconductor substrate 17 due to the voltage VH applied to the lower electrode 31.

A light with a wavelength of blue is absorbed into the first photodiode PD1 formed in the semiconductor substrate 17 close to the light sensing surface and is photoelectrically converted. Accordingly, signal charges corresponding to the blue light are accumulated in the n-type semiconductor region 19 of the first photodiode PD1. A light with a wavelength of red is absorbed into the second photodiode PD2 formed in the semiconductor substrate 17 at a deep position in a depth direction from the light sensing surface and is photoelectrically converted. Accordingly signal charges corresponding to the red light are accumulated in the n-type semiconductor region 19 of the second photodiode PD2.

After charge accumulation is finished, desired transfer pulses are applied to the transfer gate electrodes 37, 38 and 39 of the first to third transfer transistors Tr1, Tr2 and Tr3 such that reading of charges are started. In the first transfer transistor Tr1, the signal charges corresponding to the blue light accumulated in the n-type semiconductor region 19 of the first photodiode PD1 are read to the floating diffusion portion FD1 through the extension 19a. In the second transfer transistor Tr2, the signal charges corresponding to the red light accumulated in the n-type semiconductor region 19 of the second photodiode PD2 are read to the floating diffusion portion FD2. In the third transfer transistor Tr3, the signal charges corresponding to the green light accumulated in the charge accumulation layer 23 of the vertical type transmitting path 50 are read to the floating diffusion portion FD3.

Potential variations due to the reading of the respective signal charges to the respective floating diffusion portions FD1, FD2 and FD3 are amplified by the amplification transistors Tr5, Tr8 and Tr11 and are read to a vertical signal line (not shown) as pixel signals. The timings when the signal charges are read to the vertical signal line are determined by the selection transistors Tr6, Tr9 and Tr12.

After the reading and transferring of the signal charges, the signal charges read to the floating diffusion portions FD1, FD2 and FD3 are reset by the reset transistors Tr4, Tr7 and Tr10.

According to this embodiment, the signal charges generated in the organic photoelectric conversion film 32 are transferred from the connection portion 21 into the charge accumulation layer 23 by overflowing in the vertical direction so as to be accumulated in the charge accumulation layer 23, in the vertical type transmitting path 50 formed in the semiconductor substrate 17. Since the formation of the vertical type transmitting path 50 having the overflow structure of the vertical direction may be controlled with high accuracy by the ion implantation energy as described above, the manufacture thereof is easier than that of the overflow structure of the horizontal direction and the control property of the process can be improved. Since the vertical type transmitting path 50 is formed from the rear surface side to the front surface side of the semiconductor substrate 17 in the vertical direction, the pixel size is not increased and the signal charges generated in the organic photoelectric conversion film 32 can be read from the rear surface side to the front surface side of the semiconductor substrate 17.

Since the charge accumulation layer 23 can be formed so as to be close to the transfer gate electrode 39, this configuration is advantageous in terms of transfer from the charge accumulation layer 23 to the floating diffusion portion FD3. In the back irradiation type solid-state imaging device, since the multi-layer wiring layer 25 is not formed on the rear surface side of the semiconductor substrate 17 which is the light sensing surface, it is possible to form the organic photoelectric conversion film 32 and the first and second photodiodes PD1 and PD2 formed in the semiconductor substrate 17 at a small distance. Accordingly, it is possible to reduce influence of a sensitivity variation of each color due to an F value generated when the distance between the organic photoelectric conversion film 32 and the first and second photodiodes PD1 and PD2 is large.

Figure 9:
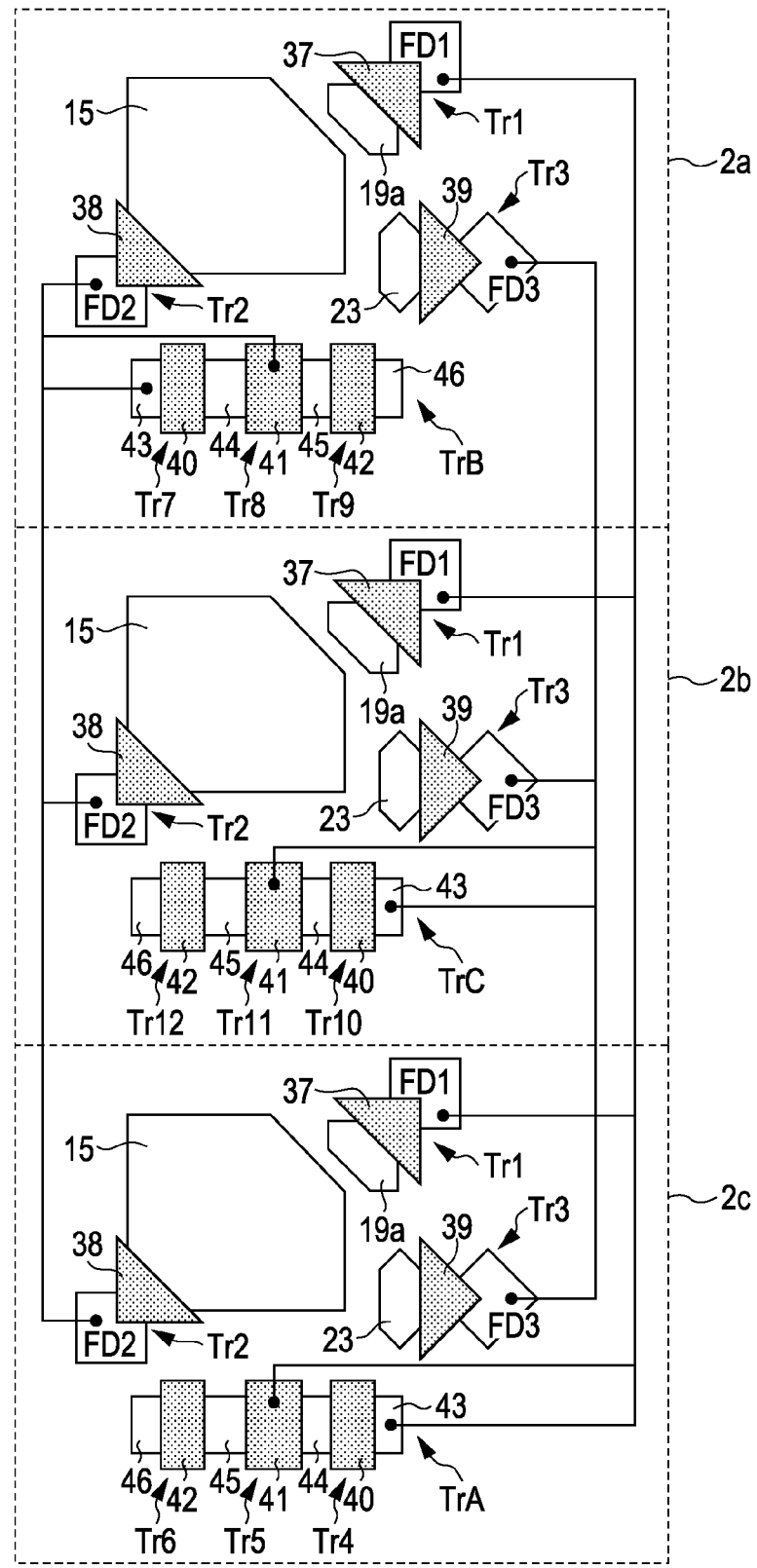
FIG. 9 is a plan view of a pixel region of a solid-state imaging device consistent with the present invention.

Although the configuration of the pixel 2 shown in FIG. 2 is used in the this embodiment, sharing each pixel transistor in a plurality of pixels may also be used. FIG. 9 is a circuit diagram of another embodiment. In FIG. 9, portions corresponding to FIG. 2 are denoted by the same reference numerals and the description thereof will be omitted.

In this embodiment, a first pixel 2a, a second pixel 2b and a third pixel 2c are arranged in a column. In the first pixel 2a, a reset transistor Tr7, an amplification transistor Tr8 and a selection transistor Tr9 for reading signal charges corresponding to a light with a wavelength of red are configured in the peripheral portion of a photoelectric conversion region 15. In the second pixel 2b, a reset transistor Tr10, an amplification transistor Tr11 and a selection transistor Tr12 for reading signal charges corresponding to a light with a wavelength of green are configured in the peripheral portion of the photoelectric conversion region 15. In the third pixel 2c, a reset transistor Tr4, an amplification transistor Tr5 and a selection transistor Tr6 for reading signal charges corresponding to a light with a wavelength of blue are configured in the peripheral portion of the photoelectric conversion region 15.

The floating diffusion portion FD2 of the first to third pixels 2a to 2c is connected to a source/drain region 43 of the reset transistor Tr7 formed in the peripheral region of the first pixel 2a and a gate electrode 41 of the amplification transistor Tr8. The floating diffusion portion FD3 of the first to third pixels 2a to 2c is connected to a source/drain region 43 of the reset transistor Tr10 formed in the peripheral region of the second pixel 2b and a gate electrode 41 of the amplification transistor Tr11. The floating diffusion portion FD1 of the first to third pixels 2a to 2c is connected to a source/drain region 43 of the reset transistor Tr4 formed in the peripheral region of the third pixel 2c and a gate electrode 41 of the amplification transistor Tr5.

In the example shown in FIG. 9, since the reset transistor, the transfer transistor and the amplification transistor are shared in each photoelectric conversion portion of the first to third pixels 2a to 2c, it is possible to reduce the number of pixel transistors so as to advantageously reduce the pixel size. Since the number of pixel transistors can be reduced, it is possible to enlarge a light sensing area of the photoelectric conversion region 15 in a state in which the pixel size is maintained. Even in this example, the effect of the present embodiment can be obtained.

Second Embodiment

Method of Manufacturing Solid-State Imaging Device

Next, a method of manufacturing a solid-state imaging device as a second embodiment of the present invention will be described. FIGS. 10A and 10B to 13A and 13B are diagrams showing a process of manufacturing the solid-state imaging device of this embodiment. The solid-state imaging device completed in this embodiment is equal to the solid-state imaging device shown in FIG. 3 and the description thereof will be omitted. In FIGS. 10A and 10B to 13A and 13B, portions corresponding to FIGS. 5A, 5B and 5C to 8A and 8B are denoted by the same reference numerals and the description thereof will be omitted.

Figure 10A:
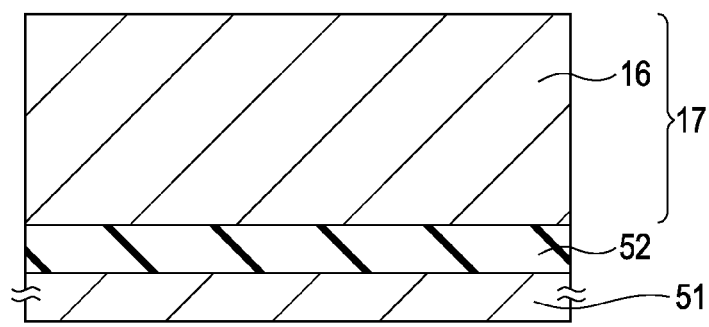
FIGS. 10A and 10B are diagrams showing a process of manufacturing a solid-state imaging device consistent with the present invention.

First, as shown in FIG. 10A, an SOI substrate obtained by sequentially forming a BOX layer 52 and a semiconductor layer 17 formed of silicon on a substrate 51 formed of silicon is prepared. This semiconductor layer 17 corresponds to the semiconductor substrate 17 of FIG. 3. The semiconductor layer 17 of the SOI substrate is a p-type semiconductor layer and the thickness thereof is about 3 μm.

Figure 10B:
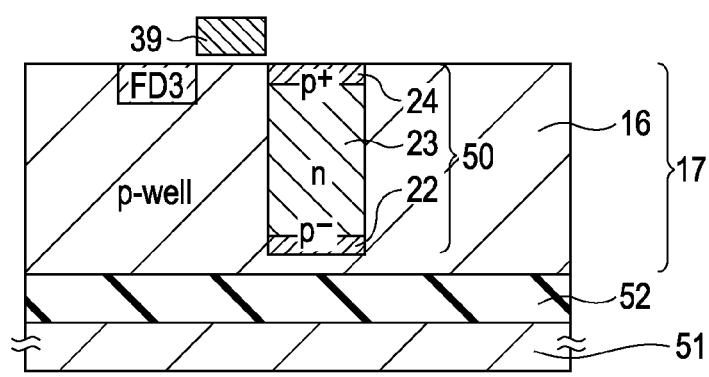

Next, as shown in FIG. 10B, p-type impurities are ion-implanted into a deep position in a depth direction of a region in which the vertical type transmitting path 50 of the semiconductor layer 17 is formed with a low concentration so as to form the potential barrier layer 22. Subsequently, n-type impurities are ion-implanted into the upper side of the potential barrier layer 22 in the vertical direction so as to form the charge accumulation layer 23. The impurity concentration of the charge accumulation layer 23 is lower than that of the connection portion 21 and the charge accumulation layer is formed by stepwise ion implantation such that the concentration thereof is gradually increased from the side of the potential barrier layer 22 to the front surface side of the semiconductor layer 17. In addition, p-type impurities are ion-implanted into the upper side of the charge accumulation layer 23, that is, the outermost front surface of the semiconductor layer 17, in the vertical direction with a high concentration so as to form a dark current suppression region which is formed of the p-type semiconductor region 24. In this embodiment, since it is difficult to form the connection portion 21 formed in a deepest region of the semiconductor layer 17 by the ion implantation from the front surface of the semiconductor layer 17, the connection portion is not yet formed in this step.

Thereafter, the transfer gate electrode 39 is formed on the front surface of the semiconductor layer 17 with a gate oxide film (not shown) interposed therebetween. In addition, n-type impurities are ion-implanted into a desired region of the front surface of the semiconductor layer 17 with a high concentration so as to form the floating diffusion portion FD3. Although not shown in FIG. 10B, at this time, the first and second photodiodes PD1 and PD2 or the pixel transistors are formed in the other regions of the semiconductor layer 17.

Figure 11A:
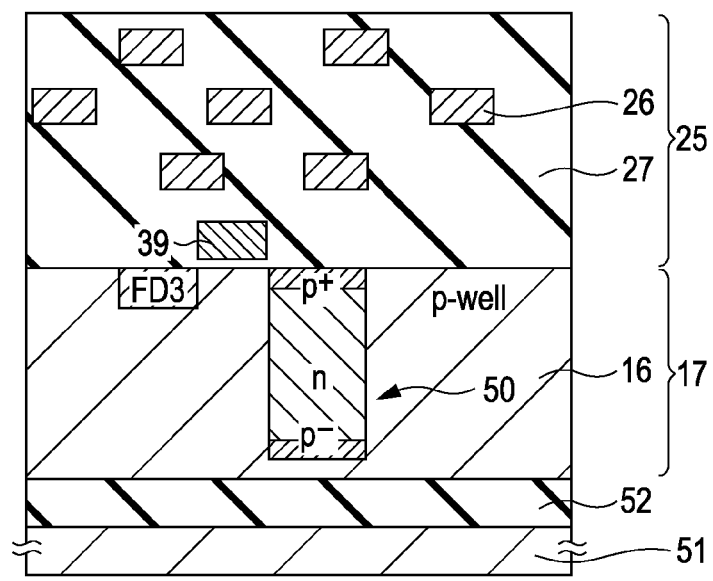
FIGS. 11A and 11B are diagrams showing the process of manufacturing the solid-state imaging device consistent with the present invention.

Next, as shown in FIG. 11A, a process of depositing the interlayer insulating film 27 formed of silicon oxide and a process of forming a metal contact (not shown) and the wiring 26 formed of a metal material on the front surface side which is the circuit forming surface of the semiconductor layer 17 are repeated. Therefore, the multi-layer wiring layer 25 formed of the interlayer insulating film 27 and the plurality of wiring layers 26 (three layers, in the present embodiment) is formed. As the metal material configuring the wiring 26 copper or aluminum may be used.

Figure 11B:
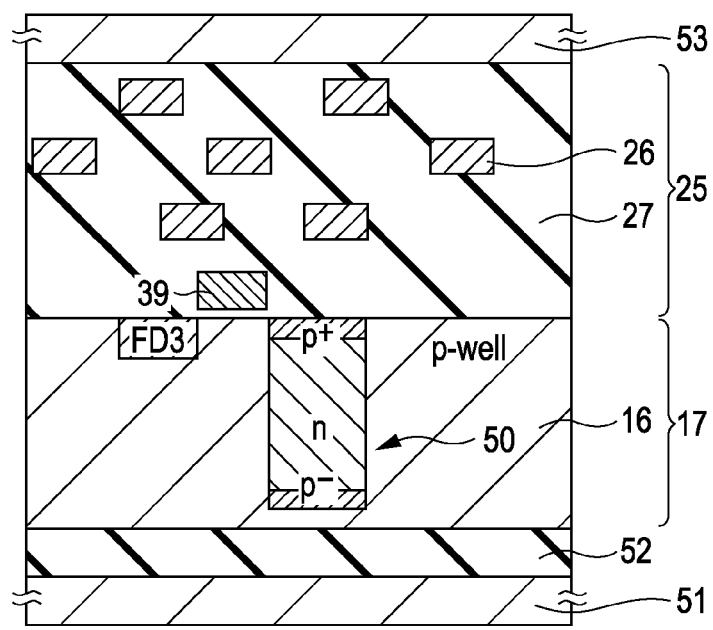

Next, as shown in FIG. 11B the support substrate 53 formed of silicon is attached onto the multi-layer wiring layer 25.

Figure 12A:
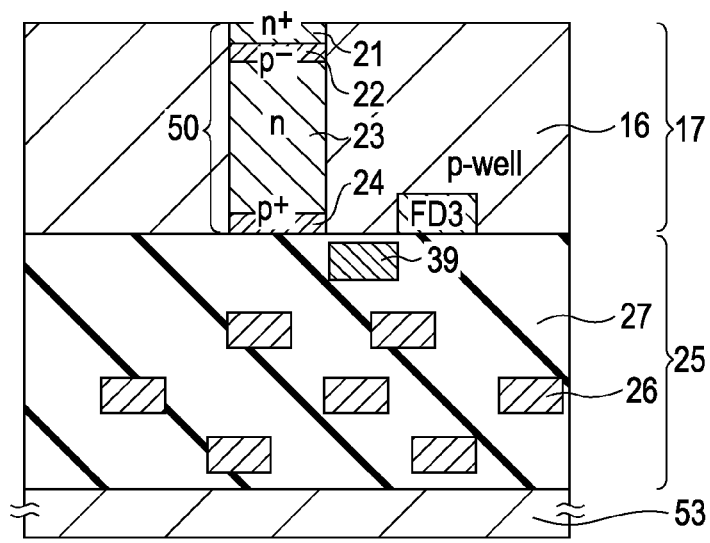
FIGS. 12A and 12B are diagrams showing the process of manufacturing the solid-state imaging device consistent with the present invention.
Figure 12B:
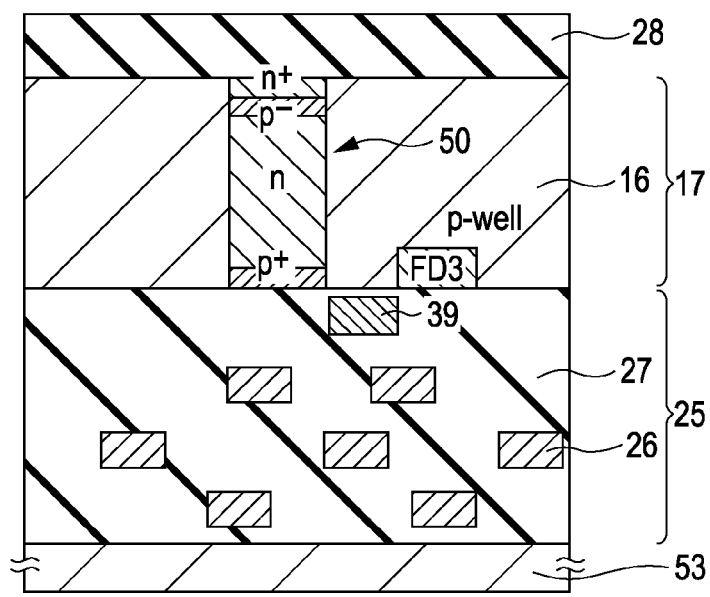
Figure 13A:
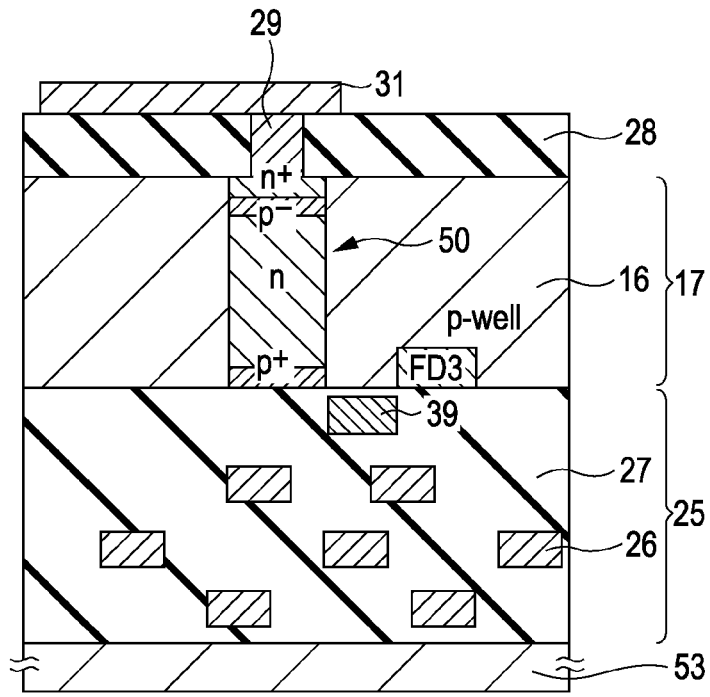
FIGS. 13A and 13B are diagrams showing the process of manufacturing the solid-state imaging device consistent with the present invention.
Figure 13B:
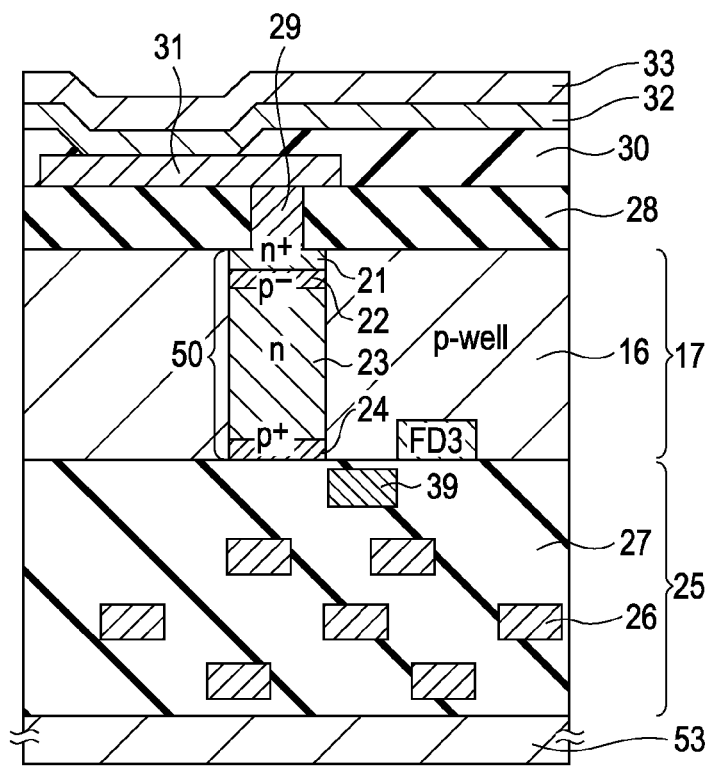

Next, as shown in FIG. 12A, the device is reversed, the substrate 51 and the BOX layer 52 configuring the SOI substrate are removed, and the rear surface side which is the light sensing surface of the semiconductor layer 17 is exposed. Next, n-type impurities are ion-implanted into the upper region of the potential barrier layer 22 of the exposed outermost front surface of the semiconductor layer 17 with a high concentration so as to form the connection portion 21. The dose of the connection portion 21 is about $1\times10^{15}/cm^3$, for ohmic contact with the contact plug 29 for extracting signal charges from the organic photoelectric conversion film 32. Thereafter, the activation of the impurity region formed in the semiconductor layer 17 is performed. In this embodiment, since the multi-layer wiring layer 25 is previously formed on the front surface side of the semiconductor layer 17 in this step, a laser anneal method which is an activation method for momentarily performing activation is preferably used, from the viewpoint of heat resistance of the wiring 26.

The processes shown in FIGS. 12B to 13B are equal to those of FIGS. 7B and 8B of the first embodiment and the description thereof will be omitted.

As described above, in this embodiment, it is possible to form the vertical type transmitting path 50 having the configuration in which impurity regions are laminated in the semiconductor layer 17 in the vertical direction with high accuracy. In addition, the same effect as the first embodiment can be obtained.

Although an example of using a vertical type spectral method, in which two photoelectric conversion portions are formed in the semiconductor substrate 17 and a photoelectric conversion portion formed of an organic photoelectric conversion film 32 is laminated thereon, is described in the first and second embodiments, the present invention is not limited to this configuration. Any configuration in which a photoelectric conversion portion is configured on a semiconductor substrate and signal charges generated in the photoelectric conversion portion are transferred to and accumulated in a vertical type transmitting path formed in the semiconductor substrate so as to be read is applicable.

Third Embodiment

Solid-State Imaging Device

Next, a solid-state imaging device according to a third embodiment of the present invention will be described. The solid-state imaging device of this embodiment is an example in which a desired transfer transistor of the solid-state imaging device of the first embodiment is set to a vertical type transistor.

Figure 14:
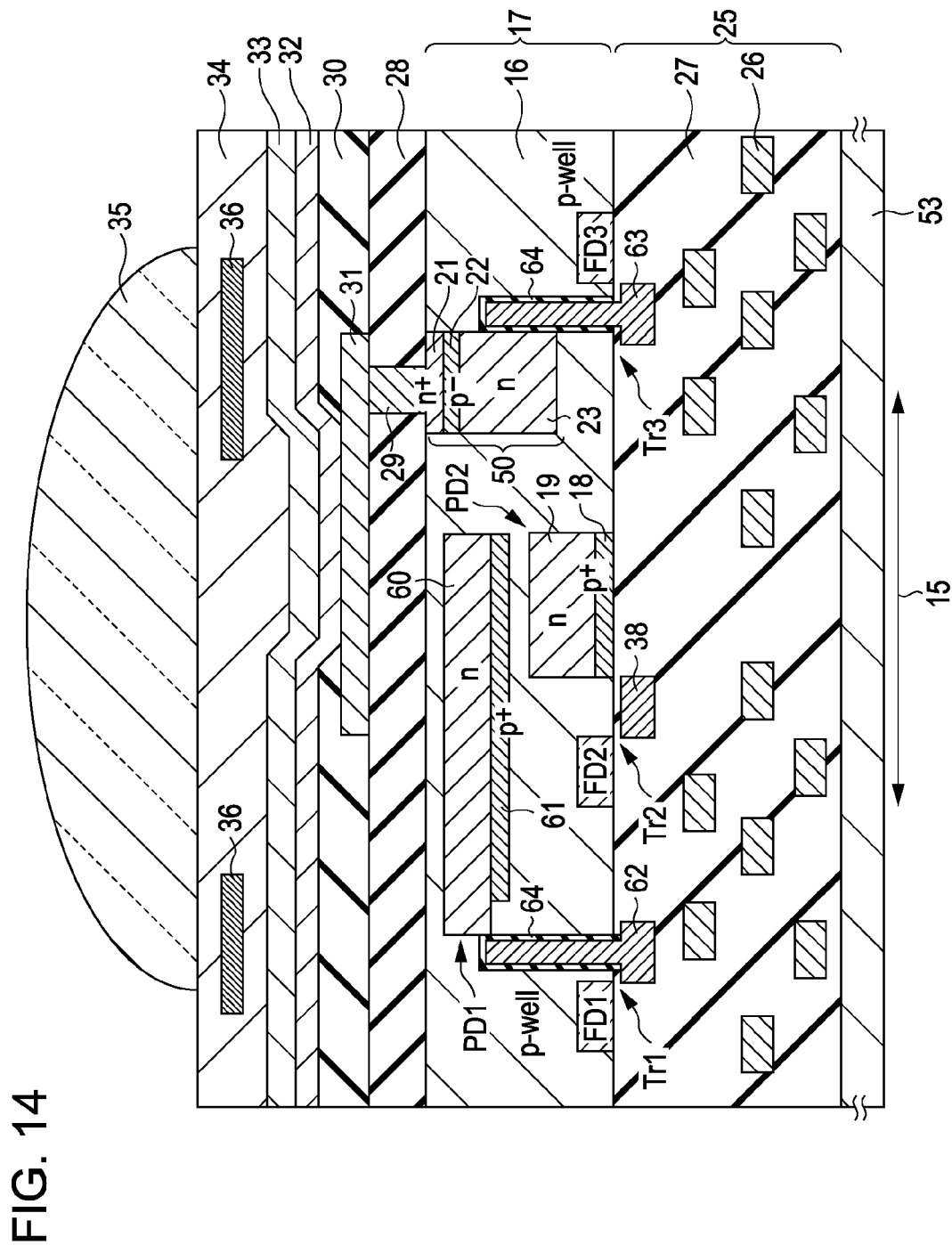
FIG. 14 is a schematic cross-sectional view of the main portions of a solid-state imaging device consistent with the present invention.

FIG. 14 is a schematic cross-sectional view of the main portions of the solid-state imaging device of this embodiment. In FIG. 14, portions corresponding to FIG. 3 are denoted by the same reference numerals and the description thereof will be omitted.

In this embodiment, the first photodiode PD1 formed on the light sensing surface side of the semiconductor substrate 17 includes an n-type semiconductor region 60 formed on the rear surface side of the semiconductor substrate 17 and a p-type semiconductor region 61 formed on the front surface side of the semiconductor substrate 17 in contact with the n-type semiconductor region 60. That is, in the first photodiode PD1 of this embodiment, the extension 19a shown in FIG. 3 is not formed.

The vertical type transmitting path 50 in the semiconductor substrate 17, through which the signal charges generated in the organic photoelectric conversion film 32 are transmitted, includes the connection portion 21, the potential barrier layer 22 and the charge accumulation layer 23 sequentially laminated from the rear surface side of the semiconductor substrate 17 in the vertical direction.

In this embodiment, the first transfer transistor Tr1 and the third transfer transistor Tr3 include vertical type transfer transistors having vertical type gate electrodes 62 and 63. That is, the vertical type gate electrode 62 configuring the first transfer transistor Tr1 is buried and formed in the semiconductor substrate 17 from the front surface side of the semiconductor substrate 17 so as to reach the n-type semiconductor region 60 of the first photodiode PD1. The vertical type gate electrode 63 configuring the third transfer transistor Tr3 is buried and formed in the semiconductor substrate 17 from the front surface side of the semiconductor substrate 17 so as to reach the charge accumulation layer 23 of the vertical type transmitting path 50.

Such vertical type gate electrodes 62 and 63 are formed by forming openings in a desired region of the semiconductor substrate 17 with a desired depth from the front surface side of the semiconductor substrate 17, forming a gate oxide film 64 on the side surface and the bottom of the openings, and burying an electrode material formed of polysilicon. In the vertical type gate electrodes 62 and 63, transfer channels are formed along the columnar gate electrodes such that signal charges accumulated in the n-type semiconductor region 60 of the first photodiode PD1 are transferred. Accordingly, the p-type semiconductor region 61 configuring the first photodiode PD1 is formed so as to be separated from the vertical type gate electrode 62 by a predetermined distance so as not to impede the formation of the transfer channels.

In this embodiment, the signal charges accumulated in the charge accumulation layer 23 of the vertical type transmitting path 50 are read to the floating diffusion portion FD3 through the transfer channel formed along the vertical type gate electrode 62. In the case where the vertical type gate electrode 63 is formed, the charge accumulation layer 23 may not be formed up to the front surface side of the semiconductor substrate 17. Accordingly, it is possible to facilitate design of the potential in the vertical type transmitting path 50.

Fourth Embodiment

Figure 15:
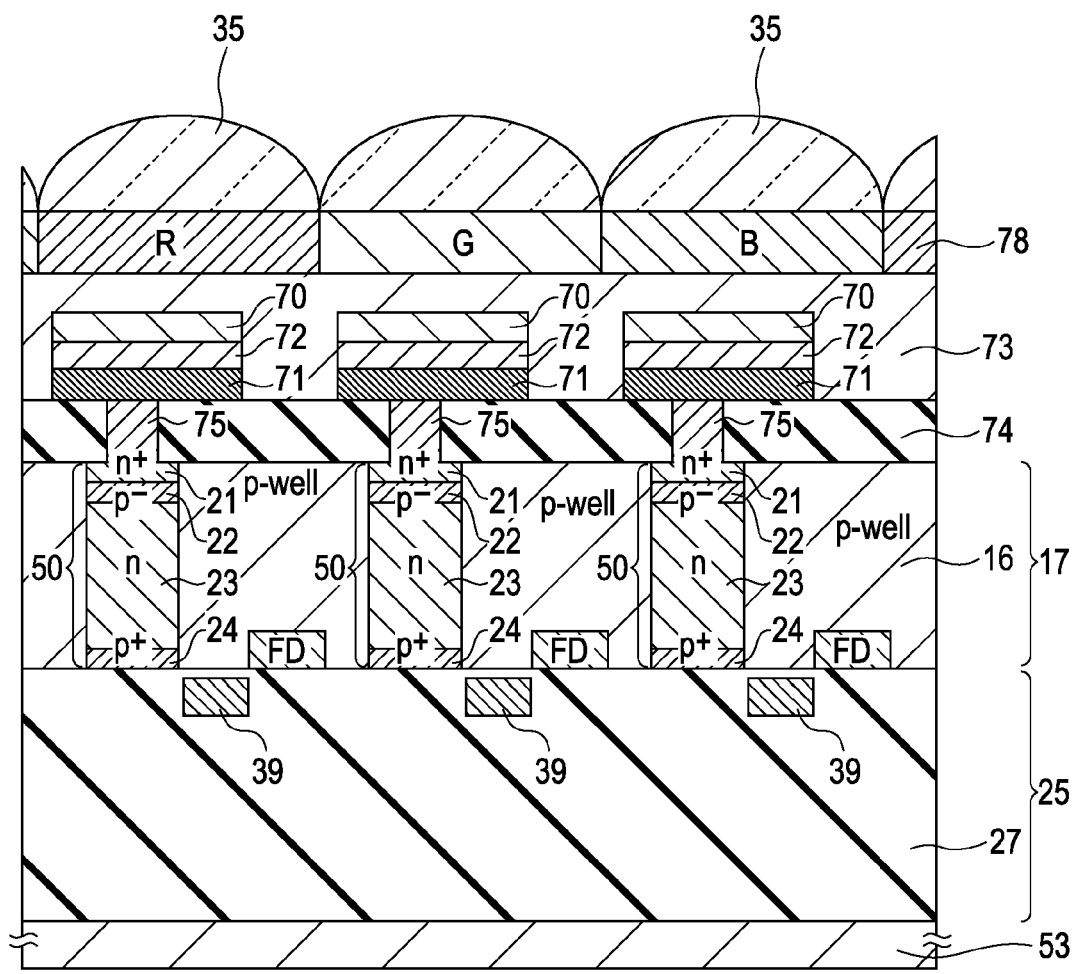
FIG. 15 is a schematic cross-sectional view of the main portions of a solid-state imaging device consistent with the present invention.

Solid-state Imaging Device Next, a solid-state imaging device according to a fourth embodiment of this invention will be described. The solid-state imaging device of this embodiment is an example in which the photoelectric conversion film formed on the semiconductor substrate is formed of an inorganic material and is an example in which vertical type spectroscopy is not used. FIG. 15 is a schematic cross-sectional view of the main portions of the solid-state imaging device of this embodiment. In FIG. 15, portions corresponding to FIG. 3 are denoted by the same reference numerals and the description thereof will be omitted.

In FIG. 15, the cross-sectional configuration of three pixels is shown. The unit pixel of the solid-state imaging device of this embodiment has a photoelectric conversion portion 72 formed of amorphous silicon which is an inorganic photoelectric conversion material. A vertical type transmitting path 50 for reading, accumulating and transferring the signal charges generated in the photoelectric conversion portion 72 to the front surface side of the semiconductor substrate 17 is included. The configuration of the vertical type transmitting path 50 and a transfer transistor Tr for reading the signal charges accumulated in the charge accumulation layer 23 of the vertical type transmitting path 50 to the front surface side of the semiconductor substrate 17 is similar to that of the first embodiment.

Amorphous silicon configuring the photoelectric conversion portion 72 is formed on the rear surface of the semiconductor substrate 17 with an insulating film 74 interposed therebetween and is interposed between an upper electrode 70 and a lower electrode 71 formed on the upper and lower sides of the light incident direction. The upper electrode 70 is formed of an ITO film which is a transparent electrode. In the lower electrode 71, an electrode having a light shielding property, such as Al, Ti or W, is preferably used, in order to prevent light transmission to Si. The lower electrode 71 is electrically connected to the connection portion 21 of the vertical type transmitting path 50 through a contact plug 75 formed in the insulating film 74.

The photoelectric conversion portion 72 formed of amorphous silicon is covered by a planarization film 73 and different color filters 78 are formed on the planarization film 73 in every pixel. In this embodiment, the color filters 78 corresponding to red (R), green (G) and blue (B) are configured in the respective pixel so as to become a Bayer array. On-chip lenses 35 are formed on the color filters 78 in every pixel.

This embodiment is an example of generating signal charges due to photoelectric conversion of the light of one color per unit pixel.

In this embodiment, the light incident through the on-chip lenses 35 and the color filters 78 is absorbed into in the photoelectric conversion portion 72 formed of amorphous silicon and is photoelectrically converted therein. In the photoelectric conversion portion 72 of each pixel, signal charges corresponding to R, G and B are generated by the photoelectric conversion of the light according to the color filters 78. By applying a predetermined voltage to the upper electrode 70 and the lower electrode 71, the generated signal charges are transferred to the connection portion 21 of each vertical type transmitting path 50 through the contact plug 75 and the signal charges going beyond the potential barrier layer 22 are accumulated in the charge accumulation layer 23.

Thereafter, similarly to the first embodiment, the signal charges are read by the pixel transistors and are output as the pixel signals.

Similarly to this embodiment, even in the case where the photoelectric conversion portion 72 is formed of an inorganic material such as amorphous silicon instead of the organic photoelectric conversion film, it is possible to easily transfer and accumulate the signal charges to and in the vertical type transmitting path 50 from the rear surface side to the front surface side of the semiconductor substrate 17 in the vertical direction. Even in this case, since the signal charges read to the connection portion 21 overflow in the vertical direction, it is advantageous in terms of miniaturization of the pixel.

Although, in the first to fourth embodiments, electrons are set as the signal charges as a first conductive type is an n type and a second conductive type is a p type, the present invention is applicable to a solid-state imaging device in which holes are set as the signal charges. In this case, each of the above-described semiconductor regions may be configured in an opposite conductive type semiconductor region by setting the first conductive type to a p type and setting a second conductive type to an n type.

In the first to fourth embodiments, the case of applying the present invention to the CMOS type solid-state imaging device in which unit pixels for detecting the signal charges in response to an incident light amount as a physical amount are in a matrix is described as an example. However, the present invention is not limited to the CMOS type solid-state imaging device. The present invention is not limited to any of the column type solid-state imaging devices in which a column circuit is arranged in each pixel column of a pixel unit in which pixels are arranged in a two-dimensional matrix. Although the pixel is configured by three pixel transistors including the transfer transistor, the reset transistor and the amplification transistor in the first to third embodiments, the pixel may be configured by four pixel transistors including a selection transistor in addition to the above transistors. Even in the layout of the photoelectric conversion element in each pixel or each MOS transistor, various modifications are made without departing from the scope of the present invention.

Although the case of applying the present invention to the CMOS type solid-state imaging device is described in the first to fourth embodiments, the present invention is applicable to a CCD type solid-state imaging device. In this case, the signal charges read by a reading portion through the vertical type transmitting path of the present invention are transferred in the vertical direction by a vertical transfer register of a CCD type structure and are transferred by a horizontal transfer register in a horizontal direction so as to be amplified, thereby outputting a video signal.

The present invention is not limited to the solid-state imaging device for detecting and picking up a distribution of an incident light amount of a visible light as an image and is applicable to a solid-state imaging device for picking up a distribution of an incident amount of infrared rays, X-rays or particles as an image. In addition, the present invention is applicable to all solid-state image devices (physical amount distribution detecting devices) such as a fingerprint detecting sensor for detecting and picking up a distribution of another physical amount such as pressure or electrostatic capacity as an image in a broad sense.

In addition, the present invention is not limited to a solid-state imaging device for sequentially scanning each unit pixel of a pixel unit in row units and reading pixel signals from each unit pixel. The present invention is applicable to an X-Y address type solid-state imaging device for selecting a certain pixel in pixel units and reading a signal from the selected pixel in pixel units. In addition, the solid-state imaging device may be formed as one chip or a module having an imaging function which is obtained by packaging a pixel unit, a signal processing unit or an optical system.

The present invention is not limited to a solid-state imaging device and is applicable to an imaging device. An imaging device indicates a camera system such as a digital camera or a video camera or an electronic apparatus having an imaging function, such as a mobile telephone. A module mounted in an electronic apparatus, that is, a camera module, may be an imaging device.

Fifth Embodiment

Electronic Apparatus

Figure 16:
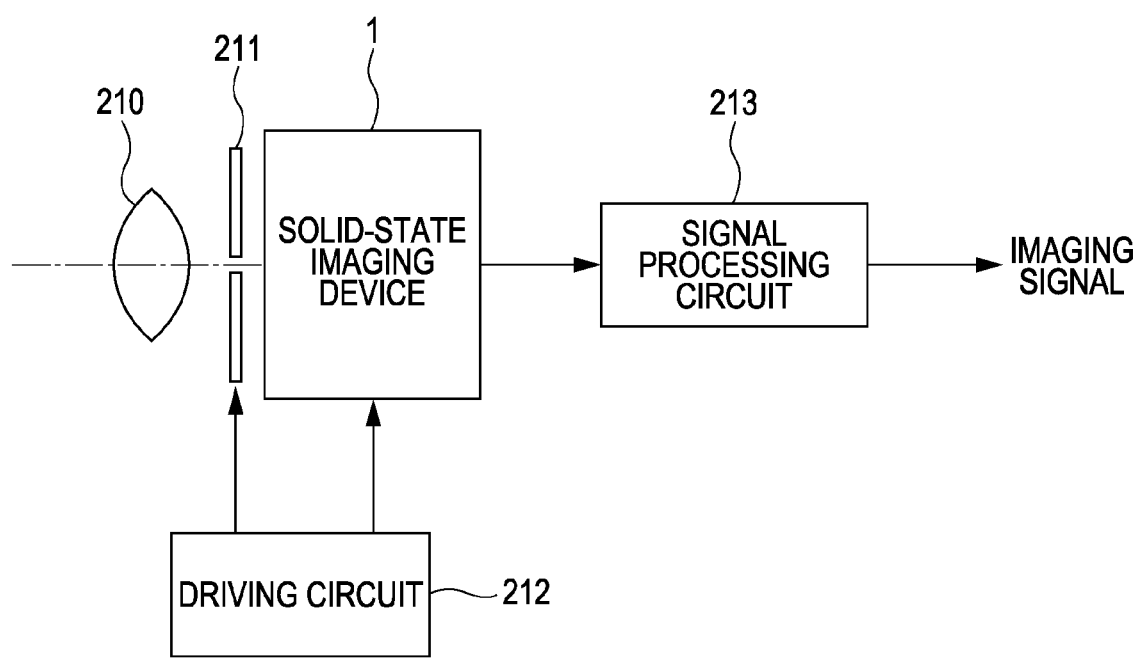
FIG. 16 is a schematic diagram of an electronic apparatus consistent with the present invention.
Figure 17:
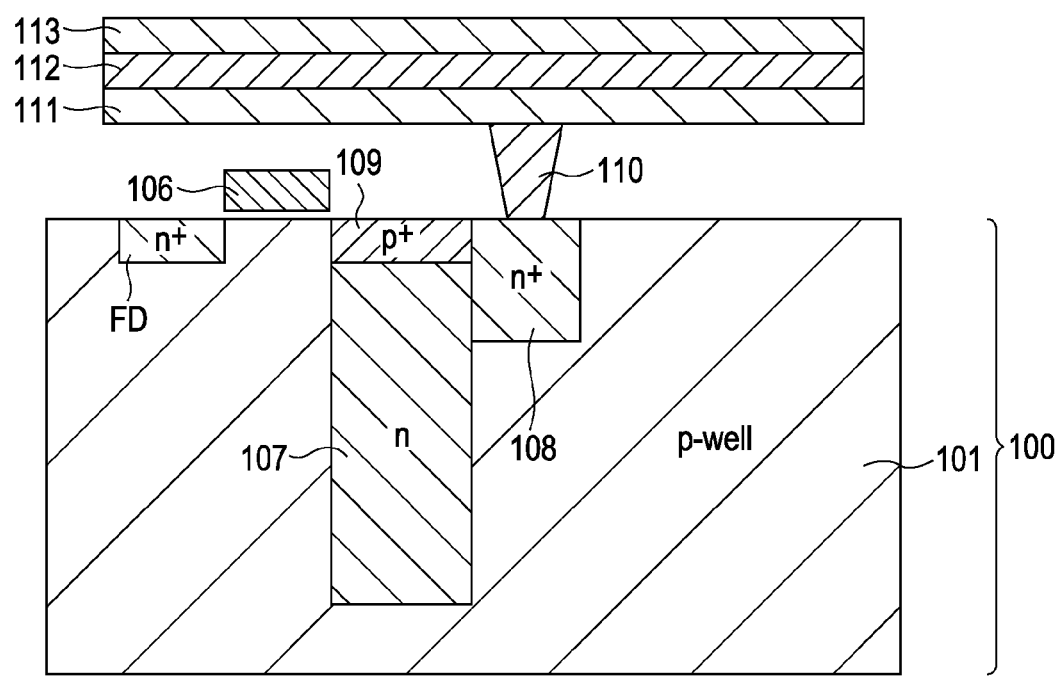
FIG. 17 is a schematic cross-sectional view of a solid-state imaging device of the related art.
Figure 18A:
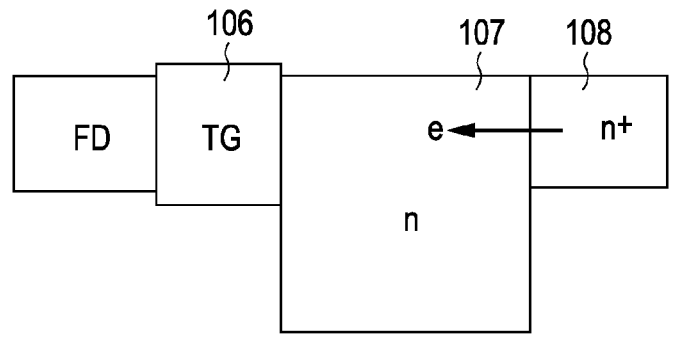
FIGS. 18A, 18B and 18C are a plan view of main portions of the solid-state imaging device of the related art, a cross-sectional view thereof, and a diagram showing a potential gradient along a line XVIIIC-XVIIIC thereof, respectively.
Figure 18B:
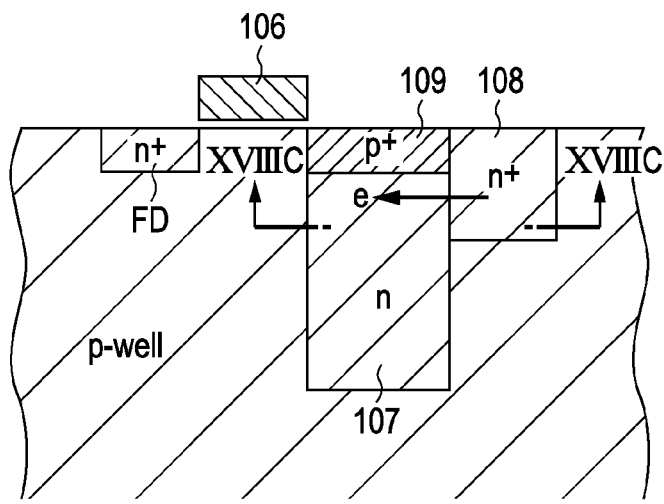
Figure 18C:
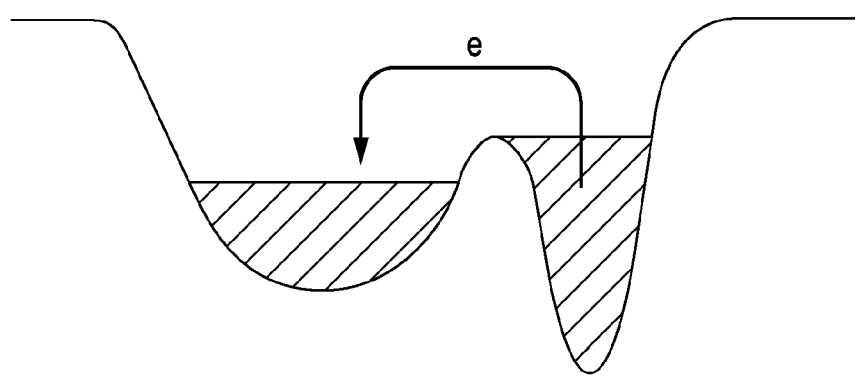
Figure 19A:
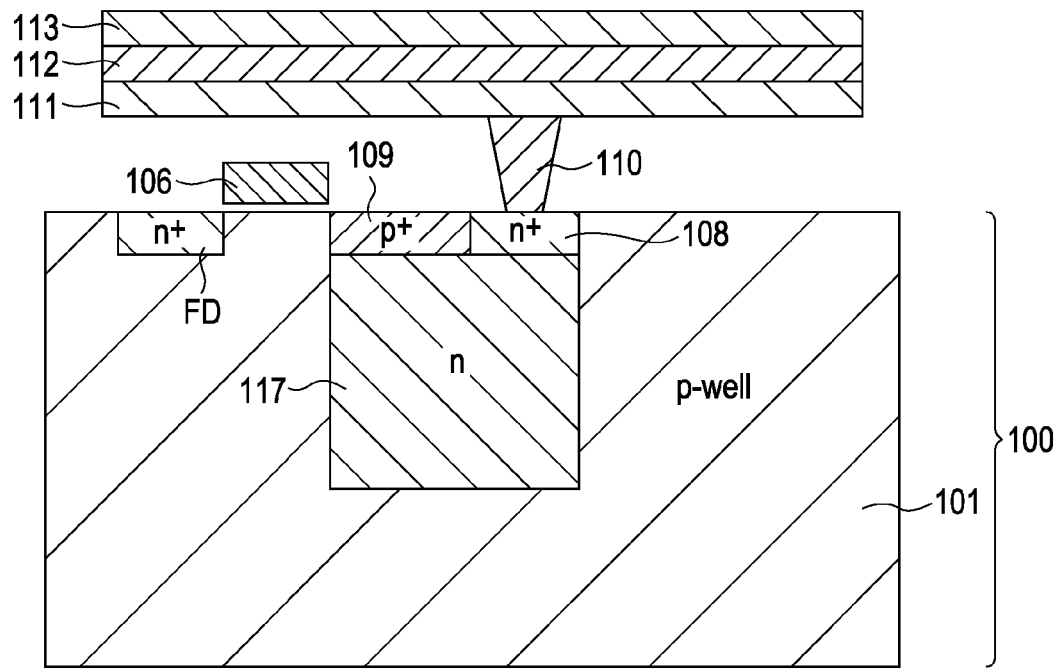
FIGS. 19A and 19B are a schematic cross-sectional diagram of the solid-state imaging device of the related art and an enlarged cross-sectional view of the main portions thereof.
Figure 19B:
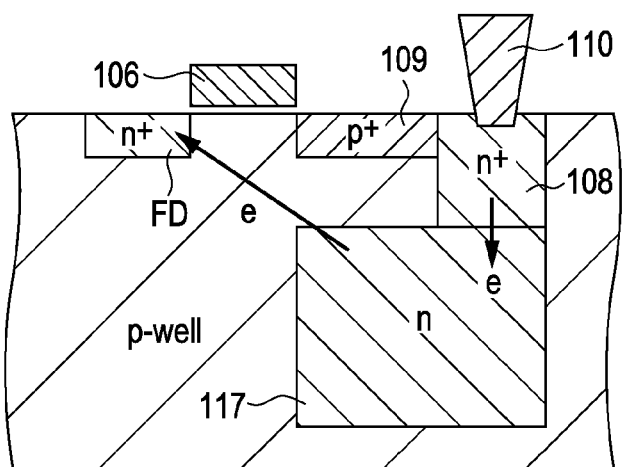

Next, an electronic apparatus according to a fifth embodiment of the present invention will be described. FIG. 16 is a schematic diagram showing the configuration of an electronic apparatus 200 according to the fifth embodiment of the present invention.

The electronic apparatus 200 of this embodiment corresponds to the solid-state imaging device 1 according to the first embodiment of the present invention is used in the electronic apparatus (camera).

The electronic apparatus 200 according to this embodiment has the solid-state imaging device 1, an optical lens 210, a shutter device 211, a driving circuit 212 and a signal processing circuit 213.

The optical lens 210 forms an image beam (incident light) from a subject on an imaging surface of the solid-state imaging device 1. Thus, signal charges are accumulated in the solid-state imaging device 1 for a predetermined period of time.

The shutter device 211 controls a light irradiation period and a light shielding period of the solid-state imaging device 1.

The driving circuit 212 supplies a driving signal for controlling a transfer operation of the solid-state imaging device 1 and the shutter operation of the shutter device 211. The signal transmission of the solid-state imaging device 1 is performed by the driving signal (timing signal) supplied from the driving circuit 212. The signal processing circuit 213 performs various signal processing procedures. The video signal subjected to signal processing is stored in a storage medium such as a memory or output to a monitor.

In the electronic apparatus 200 of this embodiment, since the miniaturization of the pixel size and transfer efficiency are improved in the solid-state imaging device 1, it is possible to obtain an electronic apparatus 200 with improved pixel characteristics.

The electronic apparatus 200 to which the solid-state imaging device 1 is applicable is not limited to a camera and is applicable to an imaging device such as a digital camera or a camera module for a mobile apparatus such as a mobile phone.

Although the solid-state imaging device 1 is used in the electronic apparatus in this embodiment, the solid-state imaging device manufactured in the above-described second to fourth embodiment may be used.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
   a semiconductor region over a multi-layer wiring layer;
   a charge accumulation layer in the semiconductor region;
   a barrier layer on the charge accumulation layer; and
   a connection portion on the barrier layer,
   wherein,
   the charge accumulation layer has an impurity concentration lower than that of the connection portion.

2. The solid state imaging device of claim 1 wherein, the barrier layer and the connection portion are stacked such that the barrier layer is positioned closer to the multilayer wiring layer than the connection portion.

3. The solid state imaging device of claim 1 wherein, the barrier layer and the charge accumulation layer are stacked such that the charge accumulation layer is positioned closer to the multilayer wiring layer than the barrier layer.

4. The solid state imaging device of claim 1, comprising:
   an insulating film on the connection portion;
   a contact portion that is in contact with the connection portion and extends through the insulating film.

5. The solid state imaging device of claim 4, wherein the contact portion electrically connects the connection portion to an electrode over the insulating film.

6. The solid state imaging device of claim 5, comprising a conversion film on an electrode.

7. The solid state imaging device of claim 4, wherein the insulating film has a negative fixed charge.

8. The solid state imaging device of claim 4, wherein the insulating film has a high refractive index.

9. The solid state imaging device of claim 4, wherein the insulating film comprises hafnium oxide.

10. The solid state imaging device of claim 4, wherein the insulating film comprises a material selected from the group consisting of: aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), hafnium nitride film, an aluminum nitride film, a hafnium oxynitride film, and an aluminum oxynitride film.

11. The solid state imaging device of claim 1, comprising a light shielding film over the connection portion.

12. The solid state imaging device of claim 1, wherein the impurity concentration of the charge accumulation layer increases proceeding in a direction toward the semiconductor region.

13. A method of manufacturing a solid state imaging device comprising the steps of:
   forming a semiconductor region over a multi-layer wiring layer;
   forming a charge accumulation layer in the semiconductor region;
   forming a barrier layer on the charge accumulation layer; and
   forming a connection portion on the barrier layer,
   wherein,
      the charge accumulation layer has an impurity concentration lower than that of the connection portion.

14. The method of claim 13 wherein, the barrier layer and the connection portion are stacked such that the barrier layer is positioned closer to the multilayer wiring layer than the connection portion.

15. The method of claim 13 wherein, the barrier layer and the charge accumulation layer are stacked such that the charge accumulation layer is positioned closer to the multi-layer wiring layer than the barrier layer.

16. The method of claim 13, comprising the steps of
   forming an insulating film on the connection portion; and
   forming a contact portion that is in contact with the connection portion and that extends through the insulating film.

17. The method of claim 16, wherein the insulating film comprises hafnium oxide.

18. The method of claim 16, wherein the insulating film comprises a material selected from the group consisting of: aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), hafnium nitride film, an aluminum nitride film, a hafnium oxynitride film, and an aluminum oxynitride film.

19. The method claim 16, wherein the contact portion electrically connects the connection portion to an electrode over the insulating film.

20. The method of claim 19, comprising the step of forming a conversion film on the electrode.

21. The method of claim 13, comprising the step of forming a light shielding film over the connection portion.

22. The method of claim 13, wherein the impurity concentration of the charge accumulation layer gradually increases towards the semiconductor region.

23. An electronic apparatus comprising:
   a solid state imaging device comprising:
      (i) a semiconductor region over a multi-layer wiring layer;
      (ii) a charge accumulation layer in the semiconductor region;
      (iii) a barrier layer on the charge accumulation layer; and
      (iv) a connection portion on the barrier layer,
      wherein,
         the charge accumulation layer has an impurity concentration lower than that of the connection portion.

24. The electronic apparatus of claim 23 wherein, the barrier layer and the connection portion are stacked such that the barrier layer is positioned closer to the multilayer wiring layer than the connection portion.

25. The electronic apparatus of claim 23 wherein, the barrier layer and the charge accumulation layer are stacked such that the charge accumulation layer is positioned closer to the multilayer wiring layer than the barrier layer.

26. The electronic apparatus of claim 23, comprising a shutter device positioned on one side of the solid state imaging device.

27. The electronic apparatus of claim 23, comprising:
   an insulating film on the connection portion;
   a contact portion that is in contact with the connection portion and extends through the insulating film.

28. The electronic apparatus of claim 27, wherein the insulating film comprises hafnium oxide.

29. The electronic apparatus of claim 27, wherein the insulating film comprises a material selected from the group consisting of: aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), hafnium nitride film, an aluminum nitride film, a hafnium oxynitride film, and an aluminum oxynitride film.

* * * * *